(12) United States Patent
Shattil

(10) Patent No.: US 6,348,791 B2
(45) Date of Patent: Feb. 19, 2002

(54) METHOD AND APPARATUS FOR A FULL-DUPLEX ELECTROMAGNETIC TRANSCEIVER

(75) Inventor: Steven J. Shattil, Boulder, CO (US)

(73) Assignee: GenghisComm, L.L.C., Boulder, CO (US)

( * ) Notice: Subject to any disclaimer, the term of this patent is extended or adjusted under 35 U.S.C. 154(b) by 0 days.

(21) Appl. No.: 09/821,547

(22) Filed: Mar. 29, 2001

Related U.S. Application Data

(62) Division of application No. 08/279,050, filed on Jul. 22, 1994, now Pat. No. 6,208,135.

(51) Int. Cl.[7] .............................................. G01N 27/72
(52) U.S. Cl. ...................................... 324/225; 202/233
(58) Field of Search ........................ 324/207.11–207.16, 324/225, 234, 236, 239, 260, 207.17, 202, 233, 241, 245, 656, 242, 243; 327/510, 511; 335/84, 301; 84/727, 728; 342/417, 448

(56) References Cited

U.S. PATENT DOCUMENTS

| | | | |
|---|---|---|---|
| 5,264,862 A | * | 11/1993 | Kumpfbeck ................. 343/853 |
| 5,280,290 A | * | 1/1994 | Evans ......................... 342/128 |
| 5,292,999 A | * | 3/1994 | Tumura ........................ 84/728 |

* cited by examiner

*Primary Examiner*—Jay Patidar
(74) *Attorney, Agent, or Firm*—Steve J. Shattil

(57) ABSTRACT

A cancellation circuit removes interfering signals from desired signals in electrical systems having antennas or other electromagnetic pickup systems. The cancellation circuit provides amplitude adjustment and phase adjustment to electrical signals induced in an electrical system by received electromagnetic signals. The cancellation circuit may be adapted to process received electromagnetic waves having multiple frequencies. Phase adjustment compensates for electrical path-length differences between signals resulting from propagation delays, circuit delays, and multipath. The amplitude-adjusted and phase-adjusted signals are combined to cancel the effects of electromagnetic interference. In an electromagnetic receiver, a plurality of receiver elements provide the cancellation circuit with different complex proportions of desired and interfering signals to enable removal of the interfering signals. An electromagnetic-wave transmitter having multiple transmitter elements is provided with a cancellation circuit for canceling electromagnetic signals in at least one predetermined region of space. A compensation circuit enables the cancellation circuit to compensate for frequency-dependent phase and amplitude differences in received signals and/or transmitted electromagnetic waves having multiple frequencies and/or broadband characteristics.

20 Claims, 10 Drawing Sheets

METHOD AND APPARATUS FOR A FULL-DUPLEX ELECTROMAGNETIC TRANSCEIVER

This application is a division of Ser. No. 08/279,050, filed Jul. 22, 1994, now U.S. Pat. No. 6,208,135, which is related to application Ser. No. 08/097,272, filed Jul. 23, 1993, now U.S. Pat. No. 5,523,526.

BACKGROUND OF THE INVENTION

The present invention relates to electromagnetic shielding for shielding electromagnetic pickups, other types of electronic equipment, and specific regions of space from electromagnetic radiation, and more particularly to active electromagnetic shielding for providing an electrical cancellation signal for canceling electromagnetic radiation or canceling the response of an electronic device to electromagnetic radiation.

It has long been known that voltages are induced in all conductors exposed to changing magnetic fields regardless of the configuration of such conductors. Electromagnetic radiation will induce electrical signals in electronic devices according to the laws of magnetic induction. Thus it has been desirable in some applications of electronic instrumentation to reduce the inductive noise caused by electromagnetic radiation.

A common method for providing electromagnetic shielding involves the use of passive electromagnetic shielding. A passive shield consisting of layers of high and low permeability material may be used to attenuate electromagnetic radiation passing through it. However, this passive electromagnetic shielding adds substantial bulk and weight to the system that it shields.

Another method for providing electromagnetic shielding is to utilize cancellation coils for generating a canceling electromagnetic radiation in opposition to incident radiation produced by external sources in order to cancel the effects of the incident radiation. In U.S. Pat. No. 5,066,891, Harrold presents a magnetic field sensing and canceling circuit for use with a cathode ray tube (CRT). Magnetic flux gate sensors provide output signals that are functions of detected fields. These signals are then used to control the current in cancellation coils that produce a cancellation magnetic field. Harold explains that it is of great importance that the CRT in a color monitor be protected from the effects of external magnetic fields, and, in particular, time-varying magnetic fields. However, this method provides no compensation to the frequency-dependent amplitude and phase responses of the sensor that picks up incident electromagnetic radiation and the device that generates the cancellation radiation.

Likewise, in U.S. Pat. No. 5,132,618, Sugimoto shows a magnetic resonance imaging system that includes active shield gradient coils for magnetically canceling leakage fields that would otherwise produce eddy currents in the heat-shield tube.

A common method for providing shielding to an electromagnetic pickup is to utilize identical pickup coils connected in series or in parallel so as to cancel the effects of uniform electromagnetic radiation. Pizzarello shows such a system in U.S. Pat. No. 5,045,784 for reducing inductive noise in a tachometer coil. An electric tachometer is a coil of wire that may be attached to a moving part of a motor that passes through a stationary magnetic field. The motion of the wire through the magnetic field induces a voltage that is indicative of the motor's speed. However, if the motor is powered by electricity, changes in the current powering the motor will cause a magnetic flux that also produces a voltage in the coil. Pizzarello shows a stationary pickup coil that is responsive to magnetic flux, and a means for subtracting the pickup voltage from the tachometer voltage.

Likewise, in U.S. Pat. No. 4,901,015, Pospischil shows a cancellation circuit for canceling the response of a magnetic pickup to ambient electromagnetic fields. Pospischil describes first and second pickups that are positioned in parallel with the wavefronts of an interfering electromagnetic field. With such placement, the electromagnetic field impinges simultaneously upon the first and second pickups. The pickups are connected in opposition. Thus, simultaneous impingement of the electromagnetic field upon the pickups is expected to produce a 180-degree phase displacement of the received signals.

If the electrical path lengths of the received signals in Pospischil's cancellation system are different where they are combined (summed), the relative phase difference between the received signals will not have 180-degree phase displacement. Thus, the signals will not cancel. Pospischil shows that differences in the electrical path length occur when the propagation path lengths of the signals received by the pickups are different (e.g., the signals do not impinge upon the pickups simultaneously). These differences in propagation path lengths can result from reflections, multipath delay, superpositions of multiple received signal components, or received electromagnetic signals having non-perpendicular angles of arrival.

Pospischil does not identify nor compensate for electrical path-length differences (e.g., differences in impedance) that occur between different electromagnetic receivers (pickups). Such pickup assemblies are also used with electric guitars and are known as "hum-bucking" pickups. This technique is not effective for providing a high degree of cancellation because slight differences between the pickups, even pickups that are substantially identical, cause the frequency-dependent amplitude and phase response of the pickups to differ significantly from each other. Thus the pickup signals will not be exactly out of phase and equal in amplitude when they are combined.

A prior-art method for providing shielding to an electromagnetic pickup from an electromagnetic source that produces a non-uniform field is to "unbalance" either the pickup device or the electromagnetic source. Such a method is described by Hoover in U.S. Pat. No. 4,941,388. Hoover uses amplitude-adjustment techniques to compensate for amplitude variations between the responses of separate pickups to electromagnetic radiation generated by an electromagnetic sustaining device that drives the vibrations of a string on an electric guitar. However, Hoover does not compensate for differences in the pickup coils which cause the amplitude-variation of the responses of the pickups to be frequency-dependent. Thus, Hoover's proposed solution results in poor cancellation over a broad range of frequency. Furthermore, Hoover does not compensate for phase-variations that occur between different pickup coils. The resulting cancellation from the unbalancing method is poor.

Hoover describes the operation of negative feedback in a system where a magnetic pickup provides an electrical signal to a magnetic driver that generates an electromagnetic field to which the pickup responds. Hoover mentions that the system tends to drift from the negative feedback condition at higher frequencies, and identifies the cause of this drift as distortions in the phase-response of the system resulting from the pickup, driver, and amplifier in the system. Hoover does not present an effective method for controlling the phase-response of the system, nor does Hoover present the mathematical relationships between phase and frequency resulting from the driver and pickup coils. Rather, Hoover proposes the use of a low-pass filter to reduce the gain of the system at which the negative feedback condition breaks down.

Methods of active phase-compensation are described by Rose in U.S. Pat. No. 4,907,483, U.S. Pat. No. 5,123,324, and U.S. Pat. No. 5,233,123. Rose uses active circuits for determining the frequency or frequency range of an electrical signal from an electromagnetic pickup. Active phase-adjustment is applied to the pickup signal, which is used to power an electromagnetic driver that generates an electromagnetic driving force on a vibratory ferromagnetic element of a musical instrument. The purpose of the phase-adjustment of the pickup signal is to provide a driving force to the vibratory element that is substantially in-phase with its natural motion. Because the purpose of Rose's invention is to improve the efficiency of the electromagnetic drive force on the element, it is apparent that a passive phase-compensation circuit would be preferable to Rose's active phase-compensation circuit. However, Rose does not realize the mathematical relationships between phase and frequency that provide the basis for constructing a passive phase-compensation network. Furthermore, Rose's invention does not provide simultaneous phase-compensation to more than one harmonic.

Another method for providing electromagnetic shielding is to orient the angle of a pickup coil to incident electromagnetic radiation such that the electrical current induced in the coil by the electromagnetic radiation will substantially cancel. One application of this method is shown by Burke in the *Handbook of Magnetic Phenomena*, published in 1986. Burke uses a transmitting coil that produces electromagnetic radiation and a receive coil that senses radiation. The two coils can be configured in such a way that no energy is transferred between the transmitting and receiving coils. Burke shows the receiving coil oriented with the axis of its turns at right angles to the direction of the magnetic field produced by the transmitting coil. Burke explains that the instantaneous generated voltage of the receive coil is determined by the instantaneous rate of change of the magnetic flux passing through the coil. If the flux is directed at right angles to the coil's axis, none of it is intercepted by the coil, and the instantaneous rate of change through the coil is zero. This method of cancellation was used in an electromagnetic sustain device for electric guitars marketed by T Tauri Research of Wilmette Ill. in November, 1988, and patented by Tumura, European Patent Application No. 92307423.1 filed on Aug. 13, 1992, and U.S. Pat. No. 5,292,999. The actual effectiveness of this technique is limited by several factors, such as the uniformity of the pickup coil's windings, the uniformity of the electromagnetic radiation near the pickup, interference due to other nearby conducting materials, and the difficulty of precisely positioning a pickup coil in a field whose intensity varies as the inverse square of the distance from its source.

Another method for providing active electromagnetic shielding is the differential transformer also shown by Burke. The differential transformer comprises a drive coil for generating a magnetic flux, and two pickup coils wrapped around a ferromagnetic core that includes a moveable armature that, when moved, varies the reluctance of the magnetic path associated with each pickup coil. If the two pickup coils are identical, and if the two magnetic paths about which they are wound are identical, the voltages induced in each pickup coil will be the same. However, Burke explains that the two pickup coils nor the two magnetic paths can be made exactly the same, therefore a differential transformer will always have some output voltage under zero stimulus.

Coils of wire whose currents support magnetic fields in space function as antennas radiating electromagnetic energy. There are several cancellation methods used with antennas that act as electromagnetic shielding. One of these methods is the basis of operation for a sidelobe canceller that uses an auxiliary antenna in addition to a main antenna. Combining the outputs from the two antennas results in cancellation of the antenna beam pattern in the direction of a noise source so that the effective gain of the antenna in that direction is very small. Likewise, the multiple sidelobe canceller addresses the problem of multiple noise sources.

Delay-line cancellers are used in systems where multiple radar pulses are transmitted. These cancellers are used to detect moving objects. In a single-element delay-line canceller, a received pulse is delayed and added to another pulse received later so that the pulses reflected by stationary objects are out of phase and thus cancel, whereas the pulses reflected by moving objects do not cancel.

Several methods are used to allow an antenna to simultaneously transmit and receive electromagnetic radiation. For example, in a continuous wavelength radar system, a single antenna may be employed since the necessary isolation between transmitted and received signals is achieved via separation in frequency as a result of the Doppler effect. The received signal enters the radar via the antenna and is heterodyned in a mixer with a portion of the transmitted signal to produce a Doppler beat frequency.

An intermediate-frequency receiver may use separate antennas for transmission and reception. A portion of the transmitted signal is mixed with an intermediate frequency, and then a narrow-band filter selects one of the side bands as the reference signal, which is mixed with the signal from the receiver antenna.

It is one object of the present invention to provide active electromagnetic shielding for canceling the effects of electromagnetic induction in electrical circuits. It is a related object of the present invention to reduce interference between transmitters and receivers of electromagnetic radiation that operate simultaneously. It is another object of the present invention to provide a cancellation circuit that allows a single antenna element to simultaneously transmit and receive electromagnetic radiation. It is still another object of the present invention to compensate for frequency-dependent amplitude and phase responses of electromagnetic receivers and transmitters.

SUMMARY OF THE INVENTION

In accordance with the present invention, a cancellation circuit is provided for canceling the inductive effects of electromagnetic radiation. The cancellation circuit comprises a means for acquiring or generating an electrical reference signal that is similar in shape to the inductive electrical signal produced by the electromagnetic radiation, an amplitude-adjustment circuit that adjusts the amplitude of either or both the reference signal and an electrical pickup signal containing an inductive noise component, a phase-adjustment circuit that adjusts the relative phase between the reference signal and the pickup signal such that when these signals are combined, the inductive noise component will be canceled, and a combining circuit that combines the reference and pickup signals to produce a pickup signal that is substantially free from inductive noise.

In one aspect of the present invention, the reference signal is obtained from an electromagnetic pickup that is responsive to external magnetic flux. In another aspect of the present invention, the reference signal is obtained from part of the electrical signal that is used to generate the external magnetic flux. In still another aspect of the present invention, a signal generator generates the reference signal.

The present invention provides substantial electromagnetic shielding capabilities compared to prior-art shielding devices. Because the present invention actively shields from electromagnetic flux, it is non-intrusive compared to passive shielding technologies, which use materials that are heavy and bulky and require complete enclosure in order to provide optimum shielding. Thus the present invention may be used in order to reduce or eliminate the need for passive electromagnetic shielding in certain applications. Furthermore, in addition to being superior for shielding electromagnetic radiation compared to prior-art active electromagnetic shielding technologies, the present invention may be adapted to prior-art shielding devices to improve their performance.

The cancellation effect of the present invention allows electromagnetic pickups to operate in environments containing high levels of electromagnetic noise. For example, the present invention may be integrated into a sustaining device for a stringed musical instrument (as described by Rose and Hoover) to provide a very small sustain device that both picks up and drives the vibrations of a string on the musical instrument. This sustain device would be much smaller than the devices shown by either Rose or Hoover because the improved shielding capability of the present invention allows for the electromagnetic pickups (which pick up string vibrations) and the driver (which generates an electromagnetic flux to drive those vibrations) to be placed very close together (or even share the same structure) without the effects of electromagnetic interference. Other applications of the present invention include electric tachometers that operate near devices that generate large amounts of magnetic flux, and other electromagnetic receivers such as radars that operate near sources of electromagnetic radiation. This aspect of the present invention allows an electromagnetic antenna to simultaneously operate as a transmitter and receiver by decoupling the receiver-response to the transmitted signal. The present invention may also be used to cancel the response of a radar to ground clutter.

Another aspect of the present invention further includes a compensation circuit for adjusting the pickup signal's amplitude and/or phase in order to compensate for frequency-dependent amplitude and phase responses of the pickup. The compensation circuit may also compensate for frequency-dependent amplitude and/or phase variations of electromagnetic flux generated by an electromagnetic-flux generator, such as a drive coil. The present invention may be integrated into a prior-art active magnetic shielding circuit that generates a canceling magnetic flux for canceling external magnetic flux. The present invention provides a more accurate response to external magnetic flux, and thereby improves the cancellation effect of the circuit. Such a circuit may be used to provide active electromagnetic shielding to instruments that are sensitive to magnetic or electromagnetic fields. The invention has applications as a shielding device for atomic clocks, magnetic resonance imaging apparatus, tactical instrumentation, cathode ray tubes, satellites, and spacecraft.

In another embodiment of the present invention, the electromagnetic flux generated by the drive coil provides a magnetic force upon a moving ferromagnetic element. The phase of the electromagnetic flux generated by the system may be adjusted to provide electromagnetic damping to the ferromagnetic element, and thus act as a stabilizer for that element. The electromagnetic flux may be adjusted in phase to drive the oscillations of the ferromagnetic element (as discussed by Rose) The invention allows a broad range of driving frequencies to be compensated, thus allowing for the driving of the harmonics as well as the fundamental frequency of the element.

These and other aspects of the present invention will become apparent to those skilled in the art upon consideration of the following detailed descriptions of the preferred embodiments.

DETAILED DESCRIPTION OF PREFERRED EMBODIMENTS

Figure 1:
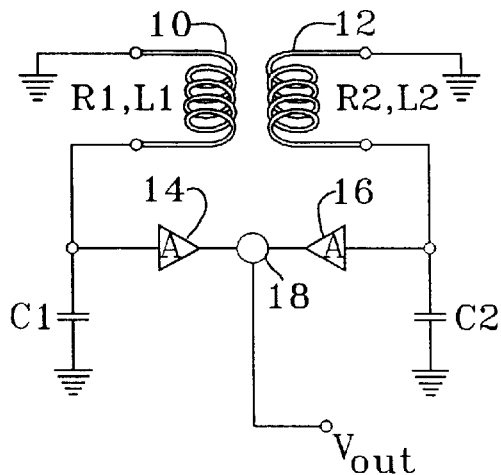
FIG. 1 is a schematic view of a prior-art cancellation circuit.

A prior-art balancing device for a pair of electromagnetic pickups shown in FIG. 1 includes a two coil assemblies, 10 and 12, two amplifiers, 14 and 16, and a combining means 18. The first pickup coil 10 has values of resistance and inductance of $R_1$ and $L_1$, respectively. The second pickup coil 12 has values of resistance and inductance of $R_2$ and $L_2$, respectively. The pickup coil 10 is connected to the input of the amplifier 14 and the pickup coil 12 is connected to the input of the other amplifier 16. The inputs to the amplifiers 14 and 16 each have a capacitor $C_1$ and $C_2$, respectively, connected to electrical ground, as is commonly done to filter out high-frequency noise and interference from the pickup signals. The outputs of the amplifiers 14 and 16 are combined by a combining circuit 18, which may be a voltage divider, a summing amplifier, or a differential amplifier.

The pickup coils 10 and 12 are responsive to external magnetic flux that induces a first electrical pickup signal in coil 10 and a second electrical pickup signal in coil 12. Due to coil-positioning with respect to the external magnetic flux, coil properties, and properties of materials (not shown) which the coils 10 and 12 may surround, the amplitude of the first electrical pickup Fan signal will most likely differ from the amplitude of the second electrical pickup signal. Thus amplifiers 14 and 16 may be used to change the amplitude of either or both of the first and second electrical pickup signals. If the pickup signals are out of phase, the combining circuit 18 is a voltage divider or a summing amplifier. If the signals are in phase, then the combining circuit 18 is a differential amplifier. However, the relative phase between the first and second electrical signals will tend to be substantially different than 0 or 180 degrees, thus providing poor cancellation of the signals at the output of the combining circuit 18.

The impedance $Z_1$ of the first pickup coil 10 is related to the coil's 10 resistance $R_1$ and inductance $L_1$: $Z_1=R_1+i\omega L_1$. Likewise, the impedance $Z_2$ of the second pickup coil 12 has the value: $Z_2=R_2+i\omega L_2$, where $\omega$ represents the frequency of the pickup signals multiplied by 2 Pi. The voltage $V_{1in}$ at the input of the first amplifier 14 is $$V_{1in}=V_1[(1-\omega^2C_1L_1)-i\omega C_1R_1]/[(1-\omega^2C_1L_1)^2+\omega^2C_1^2R_1^2],$$

where $V_1$ is the voltage induced in the coil 10 by external magnetic flux. The voltage $V_{2in}$ of the second pickup signal is $$V_{2in}=V_2[(1-\omega^2C_2L_2)-i\omega C_2R_2]/[(1-\omega^2C_2L_2)^2+\omega^2C_2^2R_2^2],$$

where $V_2$ is the voltage induced in the coil 12 by external magnetic flux. Incidentally, $V_1$ and $V_2$ are proportional to the magnitude of external magnetic flux at the locus of each pickup coil 10 and 12. The gain imparted to one or both pickup signal voltages $V_1$ and $V_2$ by the amplifiers 14 and 16 can correct for differences in the amplitude between $V_1$ and $V_2$ but can not correct for phase differences between those signals. The phase of the first pickup signal voltage $V_{1in}$ has the value $$\emptyset_1=-\text{Arc Tan}(\omega C_1 R_1/(1-\omega^2 C_1 L_1)),$$

and the phase of the second pickup signal voltage $V_{2in}$ has the value $$\emptyset_2=-\text{Arc Tan}(\omega C_1 R_2/(2-\omega^2 C_2 L_2)),$$

It is typical for the values of $L_1$ and $R_1$ to differ substantially from the values of $L_2$ and $R_2$, respectively, even for pickup coils having identical numbers of windings. For example, two coils of 34 gauge copper wire, each wound 330 times around identical cores yielded values of resistance of 16.5 and 16.7 ohms, and values of inductance of 205 uH and 194 uH, respectively. Thus when only the amplitudes of the two signals are adjusted so that they are equivalent, the relative phase between the signals prevents optimal cancellation of the signals.

The expressions shown for the pickup voltages $V_{1in}$ and $V_{2in}$ are very accurate, but not exact representations for illustrating the differences in the phase variations between the pickup coils 10 and 12. The exact impedance relations for the pickup coils 10 and 12 should also include capacitive effects. Other factors that may contribute to phase variations between the signals produced by the pickup coils 10 and 12 include ground oscillations, complexities resulting from the fact that each of the pickup coils 10 and 12 acts as a source for the electrical pickup signals, possible electrical loading between the two pickup coils 10 and 12, and variations in how the voltage leads the current in the coils 10 and 12 resulting from inductance and capacitance in each of the coils 10 and 12. Although the expressions shown for the pickup voltages $V_{1in}$ and $V_{2in}$ do not provide exact representations for the differences in the phase between the pickup coils 10 and 12, these expressions are accurate to a great degree, and represent the basis from which extremely effective cancellation circuits can be designed. It will be appreciated that even more precise representations of the electrical signals induced in electromagnetic pickups can enable the design of cancellation circuits that are even more effective.

Figure 2:
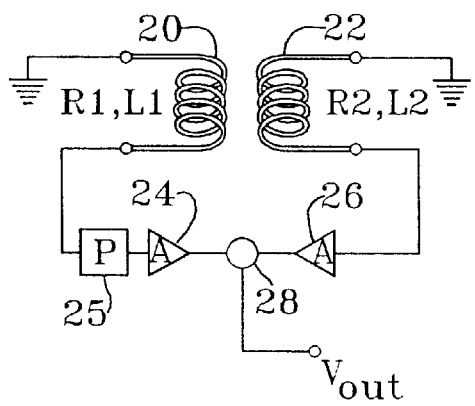
FIG. 2 is a schematic view of a cancellation circuit of the present invention.

An embodiment for a cancellation circuit of the present invention is shown in FIG. 2 as including a pair of pickup coils 20 and 22, a pair of amplitude-adjustment circuits 24 and 26, a phase-adjustment circuit 25, and a combining circuit 28. The pickup coil 20 is connected to a phase-adjustment circuit 25. The output of the phase-adjustment circuit 25 is connected to the input of an amplitude-adjustment circuit 24. The pickup coil 22 is connected to the input of an amplitude-adjustment circuit 26. The outputs of both amplitude-adjustment circuits, 24 and 26, are connected to a combining circuit 28. The output of the combining circuit 28 provides an electrical signal that is substantially free from the effects of electrical noise caused by the response of the pickup coils 20 and 22 to external magnetic flux.

The pickup coils 20 and 22 are responsive to external magnetic flux that induces a first signal voltage $V_1$ at the output of the first pickup coil 20, and a second signal voltage $V_2$ at the output of the second pickup coil 22. The phase of signal voltage $V_1$ is $\emptyset_1$ and the phase of signal voltage $V_2$ is $\emptyset_2$. Because both $\emptyset_1$ and $\emptyset_2$ are functions of signal frequency $\omega$, we will write $\emptyset_1(\omega)$ and $\emptyset_2(\omega)$. The pickup coil 20 is connected to the input of a phase-adjustment circuit 25, which provides a phase-shift $F(\omega))=(\emptyset_2(\omega))-\emptyset_1(\omega))$ to $V_1$ that compensates for the phase-difference between signals $V_1$ and $V_2$. The nature of the phase-adjustment circuit 25 is determined by the frequency range of signal cancellation required. The output of the phase-adjustment circuit 25 is connected to the input of an amplitude-adjustment circuit 24. The pickup coil 22 is connected to an amplitude-adjustment circuit 26. Both amplitude-adjustment circuits, 24 and 26, may provide amplitude-adjustment to the pickup signals $V_1$ and $V_2$, respectively. In an alternative embodiment, only one of the amplitude-adjustment circuits 24 or 26 may provide amplitude adjustment while the other circuit 26 or 24 acts only as a buffer. Because phase-adjustment circuits (such as phase-adjustment circuit 25) typically change signal-amplitude as well as phase, it is preferable that the amplitude-adjustment circuits, 24 and 26, have little effect on signal phase. Thus the amplitude-adjustment circuits, 24 and 26, may comprise non-inverting amplifiers. The outputs of the amplitude-adjustment circuits, 24 and 26, are combined in the combining circuit 28 in order to cancel the effects of external magnetic flux picked up by coils 20 and 22. Depending on whether the output signals of the amplitude-adjustment circuits, 24 and 26, are in phase or out of phase, the combining circuit 28 may comprise a voltage divider, a summing amplifier, or a differential amplifier. It will be appreciated that the coils 20 and 22 may be wrapped around a core (not shown), such as a core comprising a ferromagnetic material. It will also be appreciated that one or more additional phase-adjustment circuits may be included in series with coil 20 and/or coil 22. Furthermore, it will be appreciated that amplitude-adjustment circuits such as amplitude-adjustment circuit 24 may precede phase-adjustment circuits, such as phase-adjustment circuit 25.

Figure 3A:
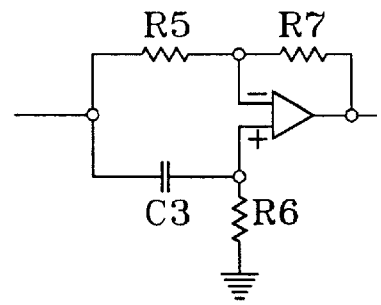
FIG. 3A is a schematic view of a phase-adjustment circuit that may be used in the cancellation circuit of the present invention.
Figure 3B:
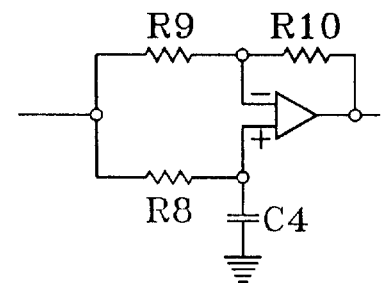
FIG. 3B is a schematic view of a phase-adjustment circuit that may be used in the cancellation circuit of the present invention.

Several phase-adjustment circuits shown in FIG. 3 may be used in the circuit shown in FIG. 2. The circuit in FIG. 3A is commonly referred to as an "all-pass filter." The all-pass filter provides a phase-shift of $\emptyset=180°-2 \text{ ArcTan}(\omega R_6 C_3)$ while producing little amplitude-variation with respect to signal frequency. The circuit shown in FIG. 3B is also an all-pass filter. It produces a phase-shift of $\emptyset=2 \text{ ArcTan}(\omega R_8 C_4)$. The all-pass filters in FIGS. 3A and 3B may be preceded by a buffer amplifier (not shown).

It is sometimes desirable to have substantial noise-cancellation over only a narrow frequency-range. This is called "notch-cancellation" and may be used in a single-frequency or band-limited system. One application for notch-cancellation is when an external magnetic flux contains a weak signal having a significantly different frequency than the noise that accompanies it, then a cancellation circuit that cancels a narrow frequency range including the noise, but not the desired signal, is preferable. Ferromagnetic materials used for pickup cores have the property of non-linear responsiveness to magnetic flux. This non-linear responsiveness is observed in a pickup signal as a higher harmonic or intermodulation product of the frequency of the magnetic flux. In order to observe the extent of the core material's non-linearity, it is preferable to cancel only the primary pickup signal, which has the same frequency $\omega$ as the applied magnetic flux. Typically, the higher harmonic signatures caused by a core's non-linearity is at least several orders of magnitude less than the intensity of the primary signal induced in the coil. Thus the method of notch-cancellation provides an advantage over conventional electrical filtering techniques in both simplicity and performance.

Figure 3C:
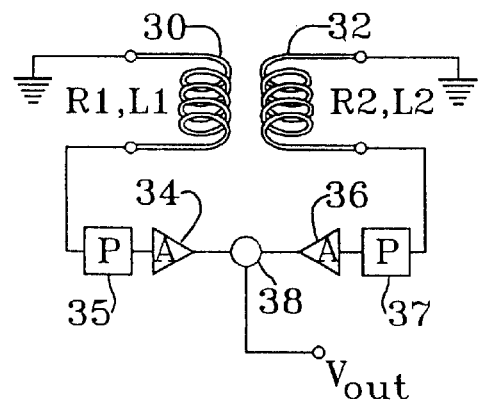
FIG. 3C is a schematic view of a circuit of an embodiment of the present invention.

FIG. 3C shows another embodiment for a cancellation circuit of the present invention. Two pickup coils 30 and 32 are each connected to a phase-adjustment circuit 35 and 37, respectively. The phase-adjustment circuits 35 and 37 are each connected to the input of an amplitude-adjustment circuit 34 and 36, respectively. The outputs of the amplitude-adjustment circuits 34 and 36 are combined by a combining circuit 38. The output of the combining circuit 38 is substantially free from inductive noise. The phase-adjustment circuits shown in FIG. 3A and FIG. 3B may be used as the phase-adjustment circuits 35 and 37 shown in FIG. 3C. Furthermore, the phase-adjustment circuits shown in FIG. 3A and FIG. 3B include a means for adjusting the amplitude of electrical signals via adjustment of the resistors $R_5$ and $R_7$ in FIG. 3A, and resistors $R_9$ and $R_{10}$ in FIG. 3B.

For the case of notch-cancellation in which the relative phase between the pickup signals from the first and second pickup coils 30 and 32 is very small, such as when the coils 30 and 32 are very close to being identical or when a phase-adjustment circuit (not shown) has already created this condition, it is preferable to select types of phase-adjustment circuits 35 and 37 that cause a very narrow frequency-range in which the cancellation is substantial. If the pickup signals from the two pickup coils 30 and 32 are in phase, this may be accomplished by selecting the all-pass filter shown in FIG. 3A as one phase-adjustment circuit 35 and selecting the all-pass filter shown in FIG. 3B as the other phase-adjustment circuit 37. This selection is suggested because as the signal-frequency $\omega$ changes, the phase of the pickup signal of one of the phase-adjustment circuits 35 increases while the phase of the pickup signal of the other phase-adjustment circuit 37 decreases, thus causing a rapid change in the relative phase with respect to frequency $\omega$. To maximize the change in the relative phase near the "notch frequency" where the cancellation is most substantial, one could select values of $R_6$ and $C_3$ in FIG. 3A and values of $R_8$ and $C_4$ in FIG. 3B such that $\omega_n R_6 C_3$ and $\omega_n R_8 C_4$ are nearly equal to 1 for the notch frequency $\omega_n$. To further narrow the cancellation notch about the notch frequency $\omega_n$, the phase-adjustment circuits 35 and 37 may each include multiple all-pass filters as shown in FIG. 3A and FIG. 3B.

For the case in which cancellation is desired over a broad frequency range (such as when the pickups 30 and 32 are part of a feedback circuit that is prone to oscillate, making it necessary to cancel the higher harmonic terms that will accompany the primary signal), phase-adjustment circuits 35 and 37 may be selected to broaden the cancellation notch about the notch frequency $\omega_n$. For example, the choice of phase-adjustment circuits 35 and 37 for two pickup signals that are in phase may both be of the type of all-pass filters shown in FIG. 3A or FIG. 3B where the values of resistance $R_6$ or $R_8$ and capacitance $C_3$ or $C_4$ are chosen to minimize the relative phase and amplitude variations with respect to frequency between the two pickup signals.

Figure 4A:
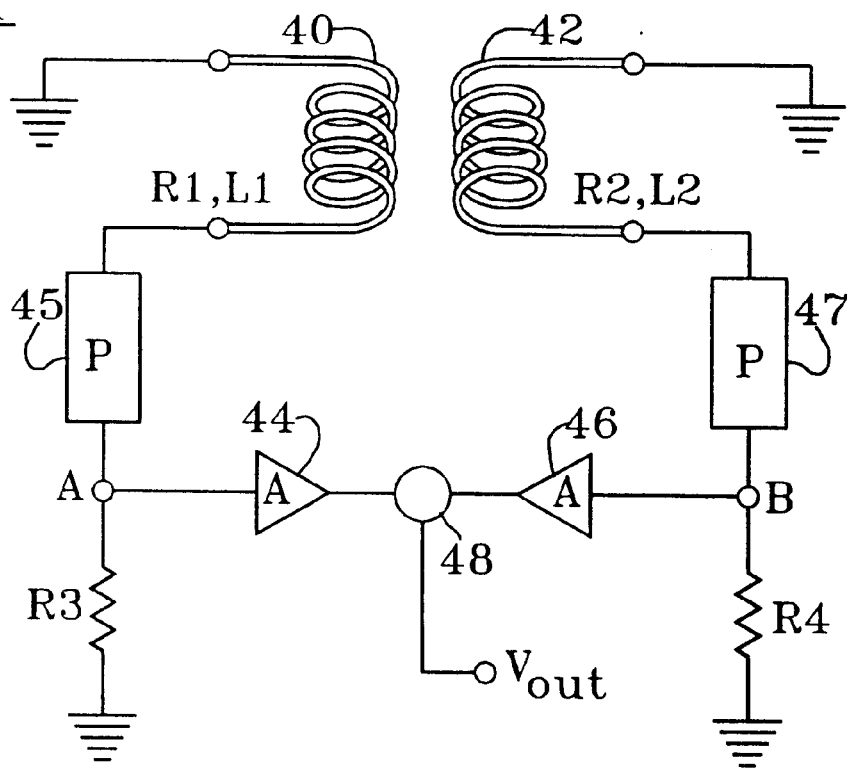
FIG. 4A is a schematic view of a cancellation circuit of the present invention that illustrates another method of phase-adjustment.

FIG. 4A shows how two phase circuits may be integrated into a circuit comprising two pickup coils 40 and 42. Coil 40 is connected to series element 45, which may include resistors and/or inductors (not shown) connected in series with the coil 40. Likewise, coil 42 is connected to series element 47, which may include resistors and/or inductors (not shown) connected in series with the coil 42. Series element 45 is connected to the input A of an amplitude-adjustment circuit 44 and series element 47 is connected to the input B of an amplitude-adjustment circuit 46. Input A includes a resistor $R_3$ connected to electrical ground, and input B includes a resistor $R_4$ connected to electrical ground. Together, the series element 45 and resistor $R_3$ form one phase-adjustment circuit, and the series element 47 and the resistor $R_4$ form another phase-adjustment circuit. The outputs of the amplitude-adjustment circuits 44 and 46 are connected to the input of a combining circuit 48 that combines the output signals of the amplitude-adjustment circuits such that the noise-signal caused by external magnetic flux substantially cancels.

The effective impedance of the coil 40 at the input A of the amplitude-adjustment circuit 44 includes the actual impedance of the coil 40 added to the impedance of the series element 45, and is represented by $Z_1=R_1+i\omega L_1$. The effective impedance of the coil 42 at the input B of the amplitude-adjustment circuit 46 includes the actual impedance of the coil 42 added to the impedance of the series element 47, and is represented by $Z_2=R_2+i\omega L_2$. The voltage of the pickup signal induced in the coil 40 by external magnetic flux having frequency ω, measured at the input A is $$V_{1A}=R_3V_1/(R_1+R_3+i\omega L_1),$$

where $V_1$ is the voltage-magnitude of the signal induced in the pickup coil 40 by the external magnetic flux. The signal voltage induced in the coil 40 by external magnetic flux having frequency ω, measured at the input B is $$V_{2B}=R_4V_2/(R_2+R_4+i\omega L_2),$$

where $V_2$ is the voltage-magnitude of the signal induced in the pickup coil 42 by the external magnetic flux. The phase of the voltage of the pickup signal at the input A is $$\emptyset_1=\text{Arc Tan}(-\omega L_1/(R_3+R_1)),$$

and the phase of the voltage of the pickup signal at the input A is $$\emptyset_2=\text{Arc Tan}(-\omega L_2/(R_4+R_2)).$$

In order that $\emptyset_1=\emptyset_2$ for a broad range of signal-frequencies ω, it is necessary that the series element 45 and/or series element 47 be adjusted such that $L_1/(R_3+R_1)=L_2/(R_4+R_2)$. This may also be accomplished by adjusting resistors $R_3$ and/or $R_4$. However, if we look at the equations for signal voltage at the inputs A and B of the amplitude-adjustment circuits 44 and 46, respectively, we note that equivalence of the ratios just discussed does not, by itself, provide the condition whereby the magnitude of the voltage difference $V_{1A}-V_2B$ remains substantially constant as ω changes. Thus, in order to assure optimal cancellation over a broad range of signal frequencies, it is necessary that the series elements 45 and 47 are adjusted such that the effective resistances $R_1$ and $R_2$ are equivalent and the effective inductances $L_1$ and $L_2$ are equivalent. It is also necessary that resistance $R_3$ equal resistance $R_4$. It is possible to replace resistors $R_3$ and $R_4$ with capacitors (not shown) for filtering out high-frequency noise, However, for optimal cancellation over a broad range of signal frequencies, it is necessary that both capacitors (not shown) have substantially equal values.

It will be appreciated from the equations representing the voltages $V_{1A}$ and $V_{2B}$ at the amplifier inputs A and B, respectively, that the series elements 45 and 47 may each include a large value of series resistance so as to increase the effective resistances $R_1$ and $R_2$ of the pickup coils 40 and 42, respectively. This reduces the frequency-dependent amplitude and phase variations of the pickup signals $V_{1A}$ and $V_{2B}$. However, it is preferable that the increase in the effective resistances $R_1$ and $R_2$ of the pickup coils 40 and 42, respectively, not be the only means of phase-adjustment used in the circuit as other phase effects that are unrelated to the signal-voltage equations for $V_{1A}$ and $V_{2B}$ tend to occur.

Consider the circuit shown in FIG. 4A for a case in which it is not optimized for canceling the effects of external magnetic flux. An applied phase shift between voltages $V_{1A}$ and $V_{2B}$ that matches their phases is $$F(\omega)=\text{Arc Tan}(-\omega L_1/(R_3+R_1))-\text{Arc Tan}(-\omega L_2/(R_4+R_2)).$$

A phase-adjustment circuit that provides the required phase-shift may include a buffered input and precede either or both amplitude-adjustment circuits 44 and 46, or may follow either or both amplitude-adjustment circuits 44 and 46. The components of this phase-adjustment circuit are shown in FIG. 4B and FIG. 4C.

Figure 4B:
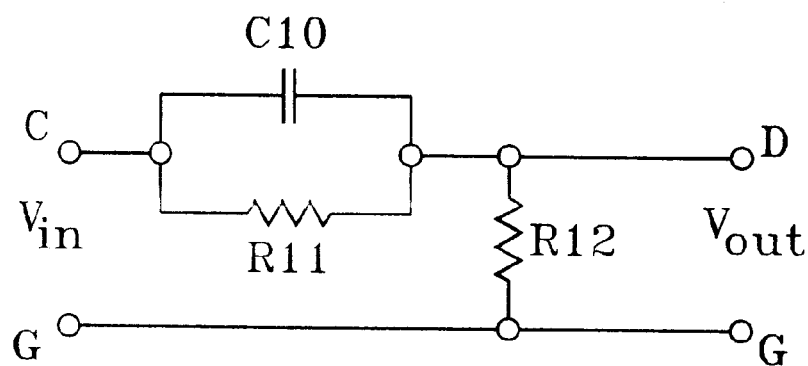
FIG. 4B is a schematic view of a phase-adjustment circuit that may be used in the cancellation circuit of the present invention.

The phase-adjustment circuit shown in FIG. 4B is a passive lead network. An input voltage $V_{in}$ is applied across terminals C and G. The output voltage $V_{out}$ of this circuit is measured across terminals D and G. The output voltage is $$V_{out}=V_{in}R_{12}(i\omega C_{10}R_{11}+1)/(R_{12}(i\omega C_{10}R_{11}+1)+R_{11}).$$

If $R_{11}>>R_{12}$, then the phase-shift is $\emptyset=\text{Arc Tan}(\omega R_{11}C_{10})$.

Figure 4C:
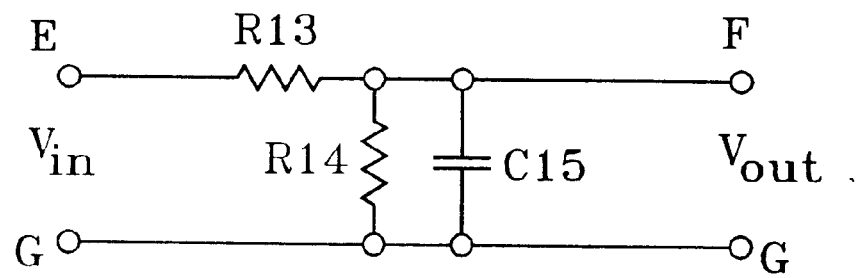
FIG. 4C is a schematic view of a phase-adjustment circuit that may be used in the cancellation circuit of the present invention.

The phase-adjustment circuit shown in FIG. 4C is a passive lag network. An input voltage $V_{in}$ is applied across terminals E and G. The output voltage $V_{out}$ of the circuit is measured across terminals F and G. The output voltage is $$V_{out}=V_{in}R_{14}/((R_{14}+R_{13})+i\omega C_{15}R_{14}R_{13}).$$

If $R_{14}>>R_{13}$, then the phase-shift is $\emptyset=-\text{Arc Tan}(\omega R_{14}C_{15})$.

The circuits in FIG. 4B and FIG. 4C provide the basis for constructing F(ω). The passive lead network shown in FIG. 4B can be combined in series with the passive lead network shown in FIG. 4C and use appropriate buffering between the lead and lag networks (such as a buffered amplifier (not shown)). Values of $R_{14}$ and $C_{15}$ are preferably selected such that $R_{14}C_{15}=L_1/(R_3+R_1)$ and values of $R_{11}$ and $C_{10}$ are preferably selected such that $R_{11}C_{10}=L_2/(R_4+R_2)$.

It should be appreciated that the phase-adjustment circuits shown in FIG. 3 and FIG. 4 are only a few of the many phase-adjustment circuits that can be used in a cancellation circuit to substantially eliminate electrical noise in a pickup signal caused by external magnetic flux. The phase-adjustment circuits shown, as well as other phase-adjustment circuits, may be used in combination for either broadening or narrowing the frequency range where a high degree of signal cancellation occurs. Phase-adjustment circuits may also be used for adjusting amplitudes of electrical signals, and thus may be employed as combined phase and amplitude-adjustment circuits.

Figure 5:
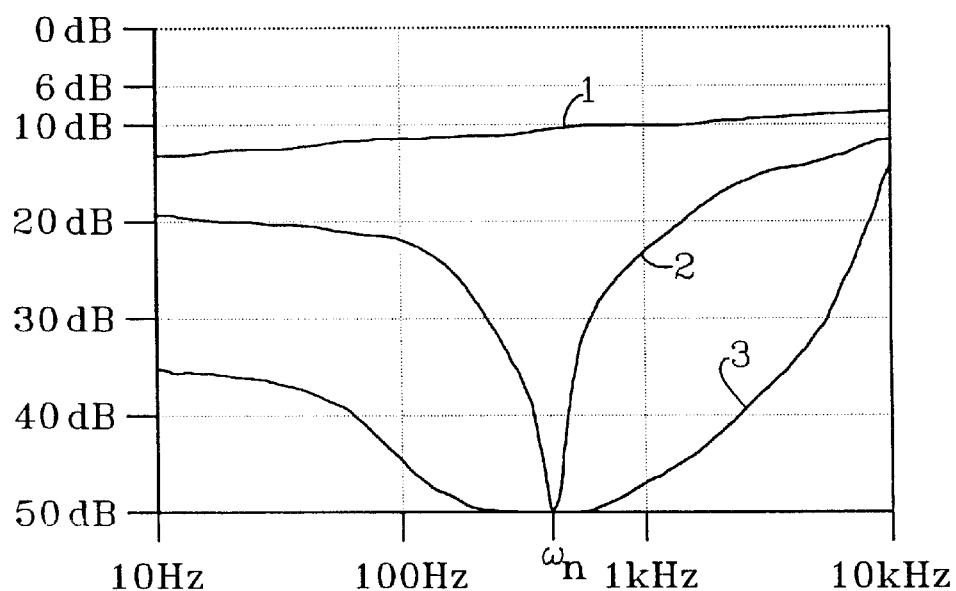
FIG. 5 is a plot of cancellation relative to signal frequency for three different cancellation circuits.

A graphical analysis of different types of cancellation is shown in FIG. 5. This graph shows three plots of cancellation (in decibels) of a combined output of two pickups at an output of a combining circuit For example, one or more plots in FIG. 5 may show the voltage magnitude $V_{out}$ of combining circuit 48 shown in FIG. 4A, divided by the voltage magnitude of the pickup signal at one of the inputs to the combining circuit 48. The graph in FIG. 5 shows cancellation plotted relative to signal frequency (Hz).

Plot 1 of FIG. 5 represents cancellation obtained by a circuit that does not compensate for phase-differences between two pickup signals, such as the prior-art circuit shown in FIG. 1. Plot 2 of FIG. 5 illustrates "notch-cancellation" as explained above with reference to the cancellation circuit shown in FIG. 3C. The frequency at which the notch occurs can be changed by adjusting the phase-adjustment circuits 35 and 37. Plot 3 of FIG. 5 represents cancellation obtained by a cancellation circuit (such as the cancellation circuit shown in FIG. 4A) that provides substantial cancellation of external magnetic flux over a relatively broad range of frequency. This curve illustrates a very broad notch centered at a notch frequency $\omega_n$. At frequencies below and above the notch frequency $\omega_n$, the degree of cancellation begins to diminish. In the case where one uses a cancellation circuit, such as the one shown in FIG. 4A, it is possible to improve the cancellation at frequencies below the notch frequency $\omega_n$ by adjusting the resistance in either or both series elements 45 and 47 so that $R_1$ better approximates the value of $R_2$. Thus, $Z_1$ better approximates $Z_2$ at low frequencies. It is also possible to improve the cancellation at frequencies above the notch frequency $\omega_n$ by adjusting the inductance in either or both series elements 45 and 47 so that $L_1$ better approximates the value of $L_2$. Thus, $Z_1$ better approximates $Z_2$ at high frequencies. Furthermore, the overall level of cancellation over the entire frequency range may be improved by adjusting the values of resistors $R_3$ and $R_4$ such that the values of these resistances better approximate each other. It will be appreciated that additional phase circuits (not shown) may be used to provide compensating phase-shifts at low and/or high frequencies in order to broaden the notch centered at the notch frequency $\omega_n$.

Figure 6:
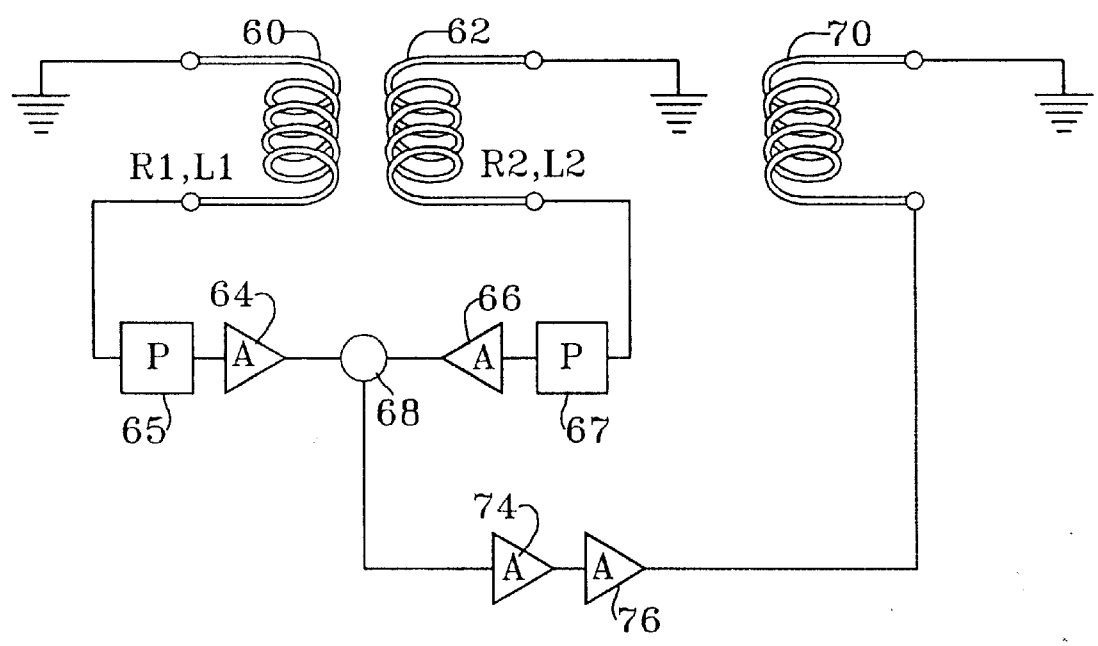
FIG. 6 is a schematic view of a cancellation circuit of the present invention that generates an electromagnetic flux in response to a pickup signal, and includes a compensation circuit for compensating for frequency-dependent phase and/or amplitude variations in electrical signals used to generate the electromagnetic flux.

FIG. 6 shows a cancellation circuit of the present invention that includes two pickup coils 60 and 62, phase-adjustment circuits 65 and 67, amplitude-adjustment circuits 64 and 66, a combining circuit 68, a preamplifier 74, a power amplifier 76, and a drive coil 70. The pickup coils 60 and 62 and/or the drive coil 70 may also include one or more ferromagnetic cores (not shown).

Pickup signals are induced in the pickup coils 60 and 62 by external magnetic flux. In this case, the external magnetic flux is generated by the drive coil 70. The phase of the pickup signal from the first pickup 60 is adjusted by the phase-adjustment circuit 65. The phase of the pickup signal from the second pickup 62 is adjusted by the phase-adjustment circuit 67 such that the phases of the two pickup signals are substantially in phase (0 degrees) or out of phase (180 degrees) for a broad range of signal frequencies. The amplitude of the first pickup signal is adjusted by the amplitude-adjustment circuit 64. The amplitude of the second pickup signal may be adjusted by the amplitude-adjustment circuit 66. However, the amplitude-adjustment circuit 66 may act only as a buffer and provide no amplitude adjustment to the second pickup signal. It will be appreciated that the amplitude-adjustment circuits 64 and 66 may provide either gain or attenuation to the pickup signals. It will also be appreciated that the amplitude-adjustment circuits 64 and 66 may be replaced by a means for adjusting the position and/or orientation of the pickup coils in order to provide adjustment to the amplitude of the pickup signals induced in either or both pickup coils 60 and 62. The outputs of both amplitude-adjustment circuits 64 and 66 are received by a combining circuit 68 that combines the pickup signals such that the pickup signals induced by the external magnetic flux generated by the driver 70 substantially cancel. The output of the combining circuit 68 is amplified by a preamplifier 74. The output of the preamplifier 74 is amplified into a drive signal by a power amplifier 76. The drive signal is an amplified pickup response of pickup coils 60 and 62 to an external magnetic flux other than the external magnetic flux generated by the drive coil 70. This other external magnetic flux may be from an electromagnetic source, such as another drive coil (not shown), or may be caused by the motion of a ferromagnetic element (not shown) in a magnetic field. The drive signal flows through the drive coil 70 and generates an external magnetic flux that cancels the magnetic flux generated by the other magnetic source (not shown). The drive coil 70 may generate a magnetic flux in response to a magnetic flux caused by motion of a ferromagnetic element (not shown). The drive coil may either drive or damp the motion of the ferromagnetic element (not shown).

For the circuit shown in FIG. 6, it is necessary that a high degree of cancellation is obtained for a broad range of frequencies, else the circuit will undergo oscillation due to direct magnetic feedback. In general, a circuit will oscillate at a frequency at which the feedback gain is positive (i.e., when the circuit gain exceeds the circuit losses). If the circuit in FIG. 6 achieves a cancellation profile similar to plot 3 in FIG. 5, the circuit may oscillate at a relatively high frequency where the cancellation is not as effective. However, a low-pass filter may be included in the feedback circuit to reduce the feedback gain of the circuit. For example, preamplifier 74 may comprise an active low-pass filter. Likewise, one or more high-pass or bandpass filters may be used to eliminate circuit oscillation. It is also possible that the phase-adjustment circuits 65 and 67 and/or amplitude-adjustment circuits 64 and 66 of the cancellation circuit may be designed specifically to filter certain frequencies.

The phase-adjustment circuits 65 and 67 are designed specifically for compensating for frequency-dependent phase-variations between the pickup signals from the pickups 60 and 62. However, the phase-adjustment circuits 65 and 67 may provide an overall phase-shift to the combined pickup signal at the output of the combining circuit 68. This overall phase-shift may compensate for the phase shift introduced to the drive signal as a result of the frequency responses of the pickups 60 and 62 and the driver 70. The phase-adjustment circuits 65 and 67 may also be used to compensate for phase shifts in the circuit caused by other circuit elements (not shown) that may precede the drive coil 70. The phase-adjustment circuits 65 and 67, are preferably preceded by a buffer (not shown), and may precede or follow the amplitude-adjustment circuits 64 and 66.

Figure 7:
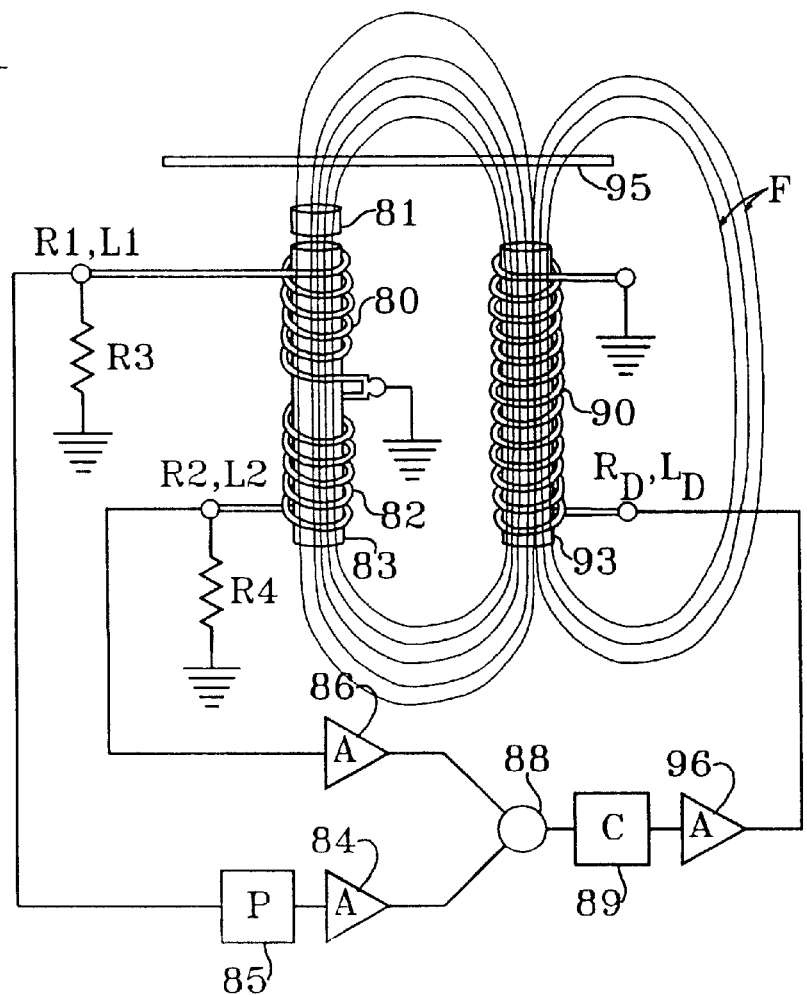
FIG. 7 is a schematic view of a cancellation circuit of the present invention that includes a compensation circuit and provides an electromagnetic drive force to a ferromagnetic element.

An embodiment for a cancellation circuit of the present invention is shown in FIG. 7. The circuit in FIG. 7 includes a magnetic element 81, a ferromagnetic core 83, two pickup coils 80 and 82 wrapped around the core 83, and a phase-adjustment circuit 85. The input to the phase-adjustment circuit is shown connected to electrical ground by a resistor $R_3$. The output of the phase-adjustment circuit is shown connected to the input of an amplitude-adjustment circuit 84. The pickup coil 82 is shown connected to the input of an amplitude-adjustment circuit 86. This input also includes a resistor $R_4$ connected to electrical ground. The outputs of each amplitude-adjustment circuit 84 and 86 are connected to a combining circuit 88. The output of the combining circuit 88 is connected to a compensation circuit 89. The compensation circuit 89 is connected to an amplifier 96 that amplifies an input signal into a drive signal that flows through a drive coil 90 wrapped around a ferromagnetic core 93.

The pickup coils 80 and 82 are shown approximately equidistant to the drive coil 90, which generates an external magnetic flux F. The pickup coils 80 and 82 receive approximately equal intensities of the external magnetic flux F generated by the drive coil 90. Amplitude adjustment of the pickup signals induced in the pickup coils 80 and 82 by the drive coil's 90 generated external magnetic flux F compensates for differences that may occur between the pickup signals, such as differences in the intensities of the drive coil's 90 generated magnetic flux F at the location of each pickup coil 80 and 82, distortions in the drive coil's 90 generated magnetic flux F resulting from nearby conducting or magnetically permeable materials (such as ferromagnetic element 95) and differences in the amplitude-responses (including frequency-dependent amplitude responses) of the pickup coils 80 and 82 to magnetic flux. Likewise, the pickup signals induced in the pickup coils 80 and 82 by uniform external magnetic flux and magnetic flux generated by other magnetic sources (not shown) disposed in the plane that is the perpendicular bisector of the height dimension of the drive coil 90 are also substantially equal in amplitude. Thus, after phase-shifting by the phase-adjustment circuit 85 and combining by the combining circuit 88, the signals induced in the pickup coils 80 and 82 by uniform external magnetic flux, the magnetic flux F generated by the drive coil 90, and magnetic flux generated by any other magnetic sources (not shown) disposed in the plane that is the perpendicular bisector of the height dimension of the drive coil 90 cancel.

The cancellation of the effects of the drive coil's 90 generated magnetic flux F on the combined pickup signal is altered if either a permeable or conducting object enters the space shared by the field patterns F of the drive coil 90 and the pickup coils 80 and 82. If the intruding object is permeable, the field pattern F surrounding the pickup coils 80 and 82 is distorted, and energy passes directly from the drive coil 90 to the pickup coils 80 and 82 through the distorted field. Thus if the ferromagnetic element 95 vibrates, the frequency of its motion is reproduced in the combined pickup signal. Because of the cancellation of external magnetic flux, the output of the combining circuit 88 comprises only the pickup signals induced by the motion of the ferromagnetic element 95.

The compensation circuit 89 provides a phase-shift to the output signal of the combining circuit 88 in order to compensate for the frequency-dependent phase variations between the magnetic flux F applied to the ferromagnetic element 95 and the response of the pickups 80 and 82 to the motion of the ferromagnetic element 95. The output signal of the phase-adjustment circuit 88 is amplified by the amplifier 96 into a drive signal which flows through the drive coil 90 and generates the magnetic flux F. This magnetic flux F may be used to either drive or damp the motion of the ferromagnetic element 95 depending on the phase of the drive signal. It is preferable to provide drive forces to the ferromagnetic element 95 such that the phase-relationship of the drive force to the motion of the ferromagnetic element 95 is not changed by the frequency of the element's 95 motion. This is particularly important if the motion of the ferromagnetic element 95 comprises a plurality of different frequencies.

For the circuit shown in FIG. 7, the signals from the pickup coils 80 and 82, after being combined, may have a total phase-shift of $$\varnothing_p = \text{Arc Tan}(-\omega L_2/(R_4+R_2))$$

The phase-shift of the drive signal at the drive coil 90 is $$\varnothing_d = \text{Arc Tan}(\omega L_d/R_d),$$

where $R_d$ and $L_d$ are the resistance and inductance, respectively, of the drive coil 90. Ignoring any phase-shifts caused by other elements in the circuit, the total phase-shift between the magnetic flux F generated by the drive coil 90 and the response of the pickups 80 and 82 to the magnetic flux F generated by the drive coil 90 is $\omega_t = \omega_p + \omega_d$. By adjusting the values of resistances $R_2$, $R_4$, and $R_d$, and/or the values of inductances $L_2$ and $L_p$, or combinations thereof, it is possible to cause the ratios $L_2/(R_4+R_2)$ and $L_d/R_d$ be substantially equal. Thus, the value of $\omega_t$ can be made substantially zero for a broad range of signal frequencies, $\omega$.

Figure 8A:
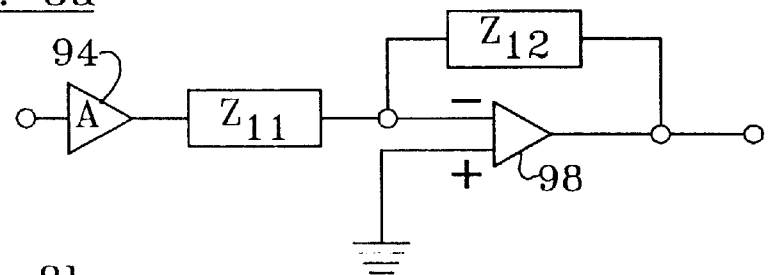
FIG. 8A is a schematic view of a compensation circuit of the present invention.
Figure 8B:
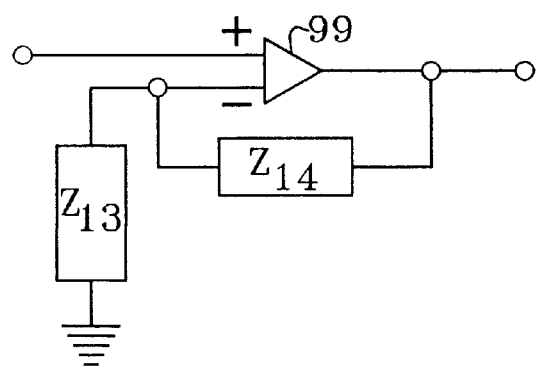
FIG. 8B is a schematic view of a compensation circuit of the present invention.

The circuits shown in FIG. 8A and FIG. 8B may be used in a cancellation circuit as phase-adjustment circuits (such as phase-adjustment circuit 85) for providing phase-shifts to pickup signals before they are combined. The circuits shown in FIG. 8A and/or FIG. 8B may be used in the feedback loop of FIG. 7 as a phase-compensation circuit, such as phase-compensation circuit 89. The circuit shown in FIG. 8A is a inverting amplifier. A buffer amplifier 94 may precede the first impedance element $Z_{11}$. The second impedance element $Z_{12}$ provides feedback between the output and inverting input of amplifier 98. The gain resulting from this inverting amplifier is $G_1 = Z_{12}/Z_{11}$. Thus the ratio $Z_{12}/Z_{11}$ maybe adjusted to compensate for phase-shifts. The circuit shown in FIG. 8B is a non-inverting amplifier comprising an amplifier 99 and gain-control impedance values $Z_{13}$ and $Z_{14}$. The gain of the non-inverting amplifier is $G_1 = 1 + Z_{14}/Z_{13}$. Likewise, the ratio $Z_{14}/Z_{13}$ may be adjusted to compensate for phase-shifts.

The circuits shown in FIG. 8A and FIG. 8B also provide a means for compensating for frequency-dependent amplitude variations in the feedback signal caused by the frequency response of the pickup coils 80 and 82, the drive coil 90, and any other circuit elements in the feedback loop. For example, the circuit shown in FIG. 7 will produce a pickup signal voltage $V_P = V_B R/(R_2+R_4+i\omega L_2)$ at the input of amplifier 86, where $V_B$ is the voltage induced in the pickup coil 82 by external magnetic flux B. The voltage $V_B$ is proportional to the magnitude of the magnetic flux B. The magnitude of magnetic flux B is proportional to the amplitude of drive current $I_d$ in the drive coil 90, where $I_d = V_d/(R_d+i\omega L_d)$ and $V_D$ is the drive voltage. Thus, the pickup signal voltage $V_P$ is proportional to $V_B R/(R_2+R_4+i\omega L_2)(R_d+i\omega L_d)$. One can observe from the equation for $V_P$ that as $\omega$ increases, the pickup signal voltage $V_P$ decreases.

An example of a circuit design that can compensate for the frequency-dependent amplitude variation of the pickup signal voltage $V_P$ includes two inverting amplifiers (as shown in FIG. 8A) connected in series. The impedance element $Z_{12}$ of the first amplifier 98A comprises a resistor $R_{12}$ (not shown) and inductor $L_{12}$ (not shown) connected in series. The value of the resistor $R_{12}$ is $(R_2+R_4)$ and the value of the inductor $L_{12}$ is $L_2$. The value of the impedance element $Z_{11}$ of the first amplifier 98A is $\alpha R_4$, where $\alpha$ is a scalar constant. The impedance element $Z_{12}$ of the second amplifier 98B comprises a resistor $R_{22}$ (not shown) and inductor $L_{22}$ (not shown) connected in series. The value of the resistor $R_{22}$ is $R_d$ and the value of the inductor $L_{22}$ is $L_d$. The value of the impedance element $Z_{21}$ of the second amplifier is $\alpha R_4$. The gain $G_1$ of the first amplifier is $(R_2+R_4+i\omega L_2)/\alpha R_4$. The gain $G_2$ of the second amplifier is $(R_d+i\omega L_d)/\alpha R_4$. The total gain of this circuit is $G_t = G_1 G_2$. The gain $G_t$ multiplies the pickup voltage $V_P$ so that the frequency-dependent nature of the pickup voltage amplitude is compensated. It should be noted that the values of $R_2$, $R_4$, and $R_d$ may be increased to reduce the frequency-dependent effects on the pickup signal voltage $V_P$. However increasing the value of $R_d$ substantially reduces the magnitude of magnetic flux generated by the drive coil 90.

The frequency-dependent phase-shifts and amplitude variations that typically occur between a pickup coil and drive coil may be substantially compensated over a broad range of signal frequencies $\omega$ via the selection of the values for electrical components in the compensation circuits that adjust both amplitude and phase-response. Typically, for a feedback system (such as shown in FIG. 7) in which the motion of a ferromagnetic element is driven by an external magnetic flux generated by the drive coil 90, the frequency-dependence of the phase of the drive signal is of more interest than the frequency-dependence of the amplitude of the drive signal. However, for a feedback system in which a drive coil generates a specific magnetic flux in response to an external magnetic flux, such as in order to cancel an external magnetic flux in a specific region of space, it is important to control both the phase and amplitude of the drive signal.

Figure 9:
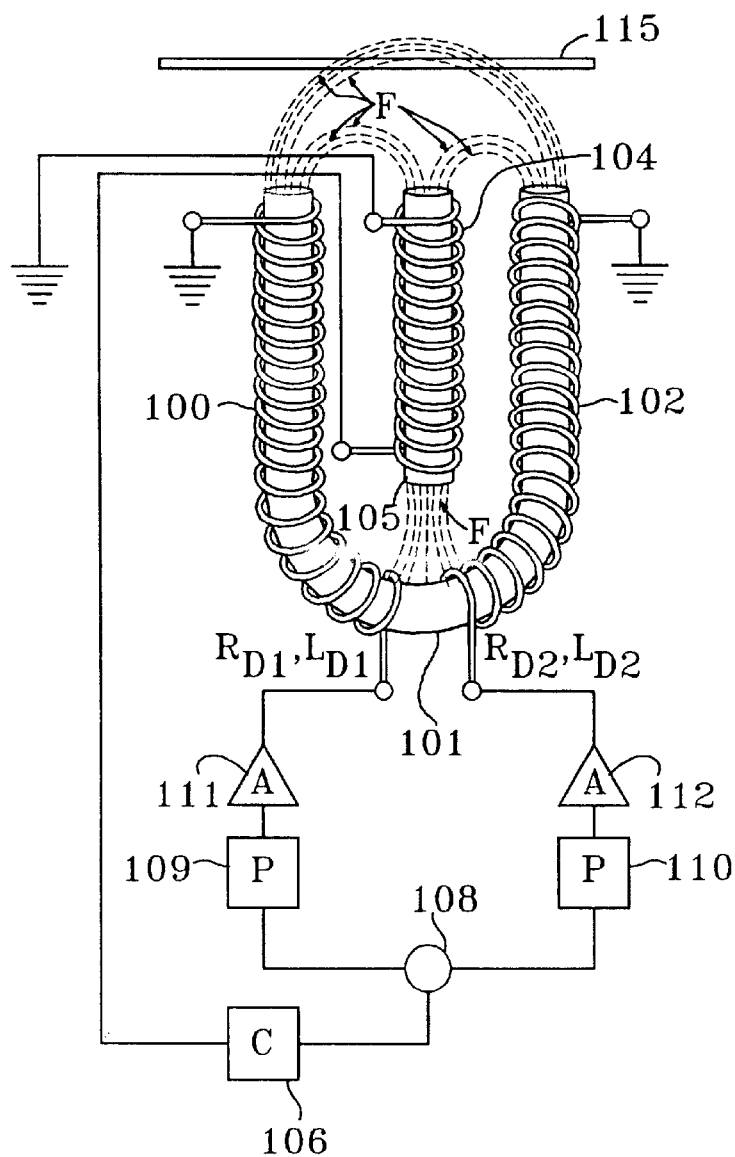
FIG. 9 is a schematic view of a cancellation circuit of the present invention wherein cancellation of incident electromagnetic flux is achieved by generating an out-of-phase electromagnetic flux.

Another embodiment for a cancellation circuit of the present invention is shown in FIG. 9. The circuit in FIG. 9 includes a pickup coil 104 wrapped around a pickup core 105. The pickup core 105 may be made of a ferromagnetic material, and the core 105 may be magnetized. The pickup coil 104 is connected to a compensation circuit 106 that is connected to a splitting circuit 108. The splitting circuit 108 has a first output connected to a first phase-adjustment circuit 109 and a second output connected to a second phase-adjustment circuit 110. The first phase-adjustment circuit 109 is connected to the input of a first amplifier 111 and the second phase-adjustment circuit 110 is connected to the input of a second amplifier 112. The output of the first amplifier 111 is connected to a first drive coil 100, and the output of the second amplifier 112 is connected to a second drive coil 102. Both the first and second drive coils 100 and 102, respectively, are wrapped around a drive core 101, and they generate a magnetic flux F. The drive core 101 may be made of a ferromagnetic material, and it may be magnetized. In this case, the drive core 101 is shaped so that both of its endpoles are in close proximity to a ferromagnetic element 115. The ferromagnetic element 115 induces a current in the pickup coil 104 when its motion disturbs the distribution of magnetic flux F that passes through the pickup coil 104. The shape of the drive core 101 concentrates the magnetic flux lines F generated by electrical current in the drive coils 100 and 102 so as to provide a more efficient magnetic drive force to the ferromagnetic element 115.

A first electrical pickup signal $V_{D1}$ is induced in the pickup coil 104 by magnetic flux generated by the first drive coil 100, and a second pickup signal $V_{D2}$ is induced in the pickup coil 104 by magnetic flux generated by the second drive coil 102. An electrical pickup signal $V_{Pickup}$ is induced in the pickup coil 104 by magnetic flux produced by other sources, such as the ferromagnetic element 115 moving through a static magnetic field. The electrical signals induced in the pickup coil 104 pass through the compensation circuit 106 to the splitting circuit 108, which splits the pickup signal into two drive signals. One of the drive signals passes through the first phase-adjustment circuit 109 and is amplified by the first amplifier 111. The other drive signal passes through the second phase-adjustment circuit 110 and is amplified by the second amplifier 112. The first drive coil 100 has an effective resistance of $R_D$, and an effective inductance $L_{D1}$, which results in a total impedance of $Z_1 = R_{D1} + i\omega L_{D1}$, where $\omega$ is the frequency of the drive signal. The second drive coil 102 has an effective resistance of $R_{D2}$ and an effective inductance $L_{D2}$ resulting in a total impedance of $Z_2 = R_{D2} + i\omega L_{D2}$. Because the impedance values $Z_1$ and $Z_2$ of drive coils 100 and 102, respectively, tend to differ from each other, a drive signal flowing through the first drive coil 100 having the same frequency $\omega$ as a drive signal flowing through the second drive coil 102 tends to differ in phase and amplitude from the second drive signal.

The phase-adjustment circuits 109 and 110 compensate for frequency-dependent phase differences between the first and second drive signals. The amplifiers 111 and 112 may provide amplitude adjustment to either or both of the drive signals to compensate for amplitude differences between the signals. The phase adjustment and amplitude adjustment is performed such that the signals $V_{D1}$ and $V_{D2}$ induced in the pickup coil 104 by the first and second drive coils 100 and 102, respectively, are substantially equal in magnitude and 180 degrees out of phase so they cancel. It will be appreciated that the splitting circuit 108 may be used to adjust the relative magnitudes of the drive signals in the drive coils 100 and 102. It will also be appreciated that the phase-adjustment circuits 109 and 110 may be positioned so that they each follow the amplifiers 111 and 112, respectively. Because phase adjustment and amplitude adjustment need only be applied to one of the two drive signals, this allows for removal of one of the phase-adjustment circuits 109 or 110.

Another method of amplitude and phase adjustment involves changing the effective resistance $R_{D1}$ and $R_{D2}$ and/or the effective inductance $L_{D1}$ and $L_{D2}$ of either or both drive coils 100 and 102. Therefore, the phase-adjustment circuits 109 and 110 follow the amplifiers 111 and 112, respectively. The phase-adjustment circuits 109 and 110 may comprise resistors (not shown) and/or inductors (not shown) connected in series with the drive coils 100 and 102 so as to adjust their effective resistance $R_{D1}$ and $R_{D2}$ and/or effective inductance $L_{D1}$ and $L_{D2}$. In order for the relative phase between the magnetic flux generated by each drive coil 100 and 102 to be substantially 180 degrees, the relationship Arc $\text{Tan}(\omega L_{D1}/R_{D1}) = \text{Arc Tan}(\omega L_{D2}/R_{D2})$ must hold for a wide range of signal frequencies $\omega$. Thus, $L_{D1}/R_{D1} = L_{D2}/R_{D2}$. However, in order for the relative amplitudes between the magnetic flux generated by each drive coil 100 and 102 to be substantially equal for a broad range of signal frequencies $\omega$, it is preferable that the effective resistance $R_{D1} = R_{D2}$ and the effective inductance $L_{D1} = L_{D2}$. It will be appreciated that because the effective resistance $R_{D1}$ and $R_{D2}$ and the effective inductance $L_{D1}$ and $L_{D2}$ can be adjusted to control both the phase and amplitude of the drive signals in the drive coils 100 and 102, only a single amplifier (not shown) for amplifying a pickup signal into a drive signal is necessary. An alternative cancellation circuit may include a single amplifier circuit (not shown) placed between the compensation circuit 106 and the splitting circuit 108, and the amplifiers 111 and 112 may be removed. The phase-adjustment circuits 109 and 110 can provide both amplitude and phase-adjustment to the drive signals going to each drive coil 100 and 102, as described above.

Figure 10:
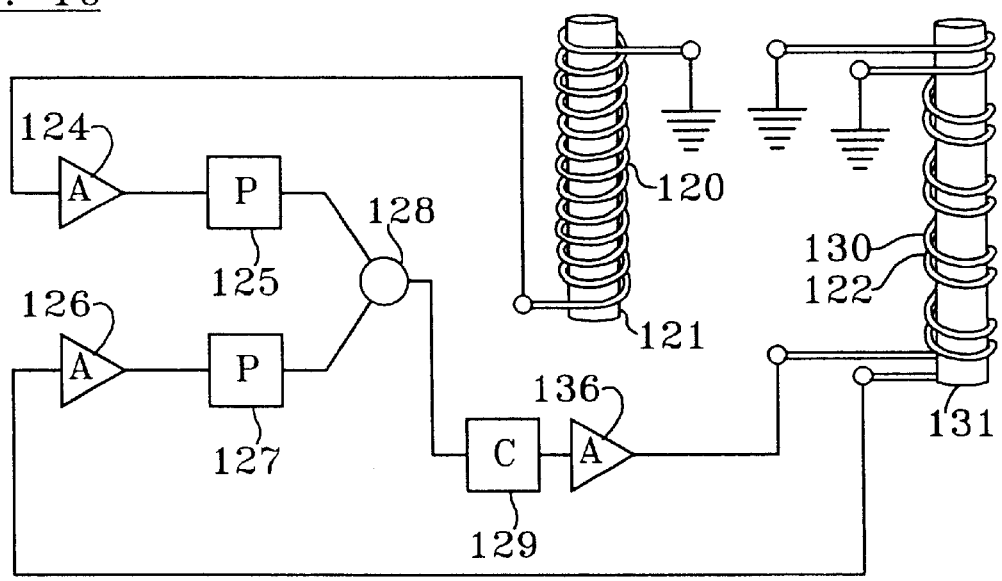
FIG. 10 is a schematic view of a cancellation circuit of the present invention wherein a pickup coil and a drive coil are wrapped around the same core.

An embodiment for a cancellation circuit of the present invention is shown in FIG. 10. The circuit in FIG. 10 includes a first pickup coil 120 wrapped around a pickup core 121, a second pickup coil 122 wrapped around a second core 131, and a drive coil 130 wrapped around the second core 131. The first pickup coil 120 is connected to the input of an amplitude-adjustment circuit 124. The output of the amplitude-adjustment circuit 124 is connected to the input of a phase-adjustment circuit 125. The second pickup coil 122 is connected to the input of an amplitude-adjustment circuit 126. The output of the amplitude-adjustment circuit 126 is connected to a phase-adjustment circuit 127. The outputs of the phase-adjustment circuits 125 and 127 are connected to a combining circuit 128. The output of the combining circuit 128 is connected to a compensation circuit 129. The compensation circuit 129 is connected to an amplifier 136 that amplifies the input signal into a drive signal that flows through the drive coil 130 and generates a magnetic flux.

The pickup coils 120 and 122 are responsive to the magnetic flux generated by the drive coil 130. However, due to the proximity of the second pickup coil 122 to the drive coil 130, the second pickup coil 122 receives a greater magnitude of magnetic flux generated by the drive coil 130 than does the first pickup coil 120. It will be appreciated that the second pickup coil 122 may be located inside of the drive coil 130, or the pickup coils 120 and 122 may be positioned, shielded or otherwise designed such that the second pickup coil 122 receives greater magnetic flux generated by the drive coil 130 than does the first pickup coil 120. The amplitudes of the pickup responses of the first and second pickup coils 120 and 122 induced by the magnetic flux generated by the drive coil 130 are made equivalent by either or both of the amplitude-adjustment circuits 124 and 126. The phases of the pickup responses of the first and second pickup coils 120 and 122 induced by the magnetic flux generated by the drive coil 130 are compensated by either or both of the phase-adjustment circuits 125 and 127 so that when the pickup signals are combined in the combining circuit 128, they substantially cancel. However, the response of the pickup coils 120 and 122 to uniform external magnetic flux results in a non-zero contribution to the combined signal at the output of the combining circuit 128. The compensation circuit 129 may comprise either or both phase-adjustment and amplitude-adjustment circuits (not shown) for adjusting the phase response and/or amplitude response of the drive signal. The drive signal flows through the drive coil 130 and generates a uniform magnetic flux inside the drive coil 130 that substantially cancels the uniform magnetic flux inside the drive coil 130 generated by other sources (not shown).

The core 121 may be a ferromagnetic core. However, ferromagnetic materials tend to have a non-linear response to magnetic flux, resulting in pickup signals comprising higher-harmonic signals. The core 131 is preferably comprised of a non-ferromagnetic material having a hollow center. If the core 121 is made of a ferromagnetic material, then it is preferable that the core 131 be made of a similar ferromagnetic material so that the non-linear responses of the cores 121 and 131 of the pickups 120 and 122 substantially cancel.

Because the drive coil 130 generates a very uniform magnetic flux along its axis it is preferable that the region of space in which cancellation of magnetic flux is desired be surrounded by the drive coil 130. However, it will be appreciated that the region of space in which cancellation is desired may be external to the drive coil 130. It will also be appreciated that the second pickup coil 122 could be wrapped around the core 131 without being interwoven with the drive coil 130, as shown. It will also be appreciated that these methods for canceling magnetic flux may be used along with a device that generates a static magnetic field to cancel external static magnetic fields.

Figure 11:
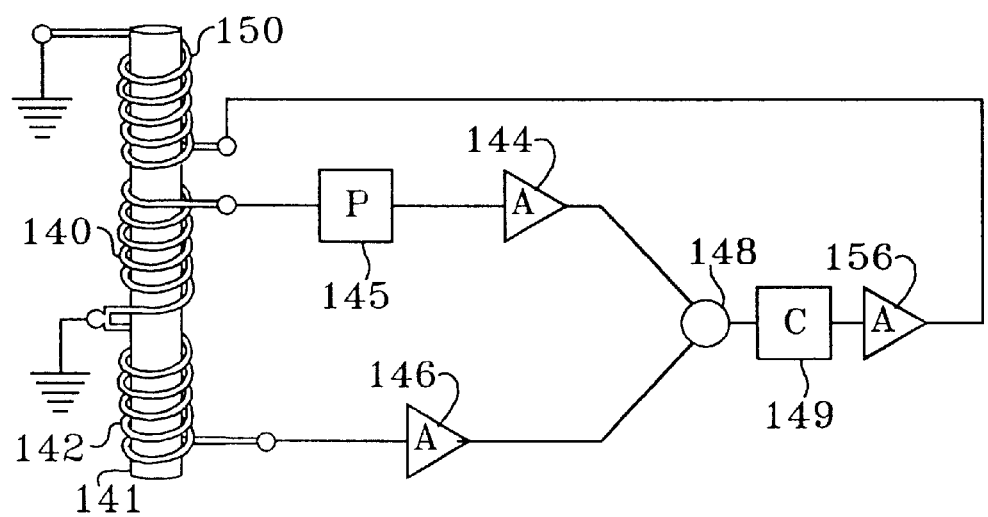
FIG. 11 is a schematic view of a cancellation circuit of the present invention wherein pickup and drive coils are wrapped around the same core.

Another embodiment for a cancellation circuit of the present invention is shown in FIG. 11. The circuit in FIG. 11 includes a first pickup coil 140 wrapped around a core 141, a second pickup coil 142 wrapped around the core 141, and a drive coil 150 wrapped around the core 141. The first pickup coil 140 is connected to the input of a phase-adjustment circuit 145. The output of the phase-adjustment circuit 145 is connected to the input of an amplitude-adjustment circuit 144. The second pickup coil 142 is connected to the input of an amplitude-adjustment circuit 146. It will be appreciated that either amplitude-adjustment circuit 144 or 146 may act only as a buffer, as amplitude-adjustment of only one of the pickup coil 140 and 142 outputs may be necessary. The output of the amplitude-adjustment circuits 144 and 146 are connected to a combining circuit 148. The output of the combining circuit 148 is connected to a compensation circuit 149. The compensation circuit 149 is connected to an amplifier 156. The amplifier 156 amplifies its input signal into a drive signal that flows through the drive coil 150, and generates a magnetic flux.

The pickup coils 140 and 142 are responsive to the external magnetic flux generated by the drive coil 150. The pickup coils 140 and 142 maybe positioned relative to the drive coil 150 as shown in FIG. 11 such that one of the pickup coils, such as pickup coil 140, receives a greater amount of the magnetic flux generated by the drive coil 150 than does the second pickup coil 142. Thus when the amplitudes and phases of the pickup signals from each of the pickup coils 140 and 142 are adjusted so that the contributions of magnetic flux generated by the drive coil 150 cancel at the combining circuit 148, the combined response of the pickup coils 140 and 142 to uniform external magnetic flux are substantially non-zero. It will be appreciated that other methods may be used to adjust the responses of the pickup coils 140 and 142 to external magnetic flux, such as utilizing different numbers of coil windings in the pickups 140 and 142, and/or changing the size, shape or material of the core 141 which the pickup coils 140 and 142 are wrapped around.

The compensation circuit 149 may comprise either or both phase-adjustment circuits (not shown) and amplitude-adjustment circuits (not shown) for adjusting the phase and/or amplitude response of the drive signal so that the drive signal has a specific amplitude and phase relationship to the external magnetic flux impinging on the pickup coils 140 and 142. The drive signal flows through the drive coil 150 and generates a uniform magnetic flux inside the drive coil 150 that cancels the external magnetic flux inside the drive coil 150.

It will be appreciated that the circuit shown in FIG. 11 may be used to drive or damp the motion of a ferromagnetic element (not shown) that generates a magnetic flux as it moves through a magnetic field. In this case, the core 141 may be made of a ferromagnetic material, and it may be shaped so that both endpoles of the core 141 are in close proximity to the ferromagnetic element (not shown) for providing a more powerful and concentrated driving (or damping) force to the ferromagnetic element. To produce a driving force, the drive coil 150 preferably generates a magnetic flux that is in phase with the motion of the ferromagnetic element, increasing in strength as the speed of the ferromagnetic element toward the core increases. To produce a damping force, the drive coil 150 preferably generates a magnetic flux that is out of phase, hence opposing the motion of the ferromagnetic element.

Figure 12:
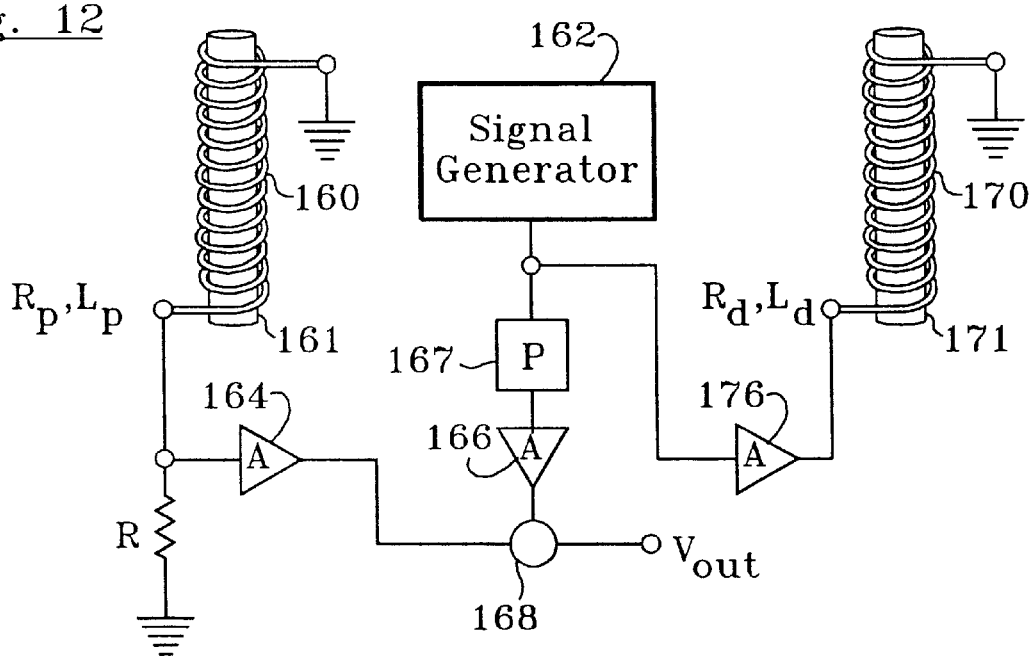
FIG. 12 is a schematic view of a cancellation circuit of the present invention wherein a reference signal is obtained from a signal generator used to provide a drive signal that generates the electromagnetic flux.

An embodiment for a cancellation circuit of the present invention is shown in FIG. 12. The circuit in FIG. 12 includes a pickup coil 160 wrapped around a pickup core 161, a signal generator 162, and a drive coil 170 wrapped around a second core 171. The pickup coil 160 is connected to the input of an amplitude-adjustment circuit 164. The signal generator 162 provides a signal to an amplifier 176 that amplifies the signal to produce a drive signal. The drive signal flows through the drive coil 170 and generates a magnetic flux. The signal generator 162 is connected to the input of a phase-adjustment circuit 167. The output of the phase-adjustment circuit 167 is connected to an amplitude-adjustment circuit 166. The outputs of the amplitude-adjustment circuits 164 and 166 are connected to a combining circuit 168. The output of the combining circuit 168 provides a pickup signal that is substantially free from the response of the pickup coil 160 to the magnetic flux generated by the drive coil 170.

The cancellation circuit shown in FIG. 12 demonstrates that in order to provide a pickup with a cancellation signal, it is not necessary to have a second pickup device. In fact, any electrical representation of a drive signal that has the proper phase and amplitude characteristics may be used to cancel the response of the pickup to external magnetic flux generated by that drive signal. In this case, the waveform of the drive signal is generated by a signal generator 162. The output of the signal generator 162 is adjusted by a phase-adjustment circuit 167 and an amplitude-adjustment circuit 166 before it is combined with the output of the pickup coil 160. An amplitude-adjustment circuit 164 is shown connected to the output of the pickup coil 160 with a resistor R connected to electrical ground. It will be appreciated that either amplitude-adjustment circuit 164 or 166 may act only as a buffer, as amplitude-adjustment of only one of the signals from either the pickup coil 160 or the signal generator 162 is necessary. It will also be appreciated that the output signal $V_{out}$ of the combining circuit 168 may be supplied to an input of the signal generator 162 to generate signals or control the frequency and amplitude of the generated signals output to the amplifier 176.

The magnetic flux generated by the drive coil 170 induces a voltage $V_B$ in the pickup coil 160 that is proportional to the magnitude of the magnetic flux. The magnitude of the magnetic flux generated by the drive coil 170 is proportional to the drive current $I_D$ in the drive coil 170. The drive current is $I_D=V_D/(R_D+i\omega L_D)$, where $R_D$ and $L_D$ are the effective resistance and inductance, respectively, of the drive coil 170, and $V_D$ is the drive voltage. The drive voltage is $V_D=G\ V_O$, where G is the gain of the amplifier 176 and $V_O$ is the signal voltage produced by the signal generator 162. The voltage $V_P$ of the pickup coil 160 at the input of the amplitude-adjustment circuit 164 is $V_P=V_BR/(R+R_P+i\omega L_P)=B\ V_OR/(R+R_P+i\omega L_P)(R_D+i\omega L_D)$, where $R_P$ and $L_P$ are the effective resistance and inductance, respectively, of the pickup coil 160, and B is a proportionality constant that represents the contribution of gains and losses in the circuit. The signal voltage at the input of the combining circuit 168 connected to the output of the amplitude-adjustment circuit 164 is $V_{CP}=A\ V_P=AB\ V_OR/(R+R_P+i\omega L_P)(R_D+i\omega L_D)$, where A is the gain of the amplitude-adjustment circuit 164. In the case where the combining circuit 168 is a differential amplifier circuit, it is desirable that the input signal, $V_{CO}$, from the output of the amplitude-adjustment circuit 166 be substantially identical to $V_{CP}$ in order for cancellation to occur.

Figure 8C:
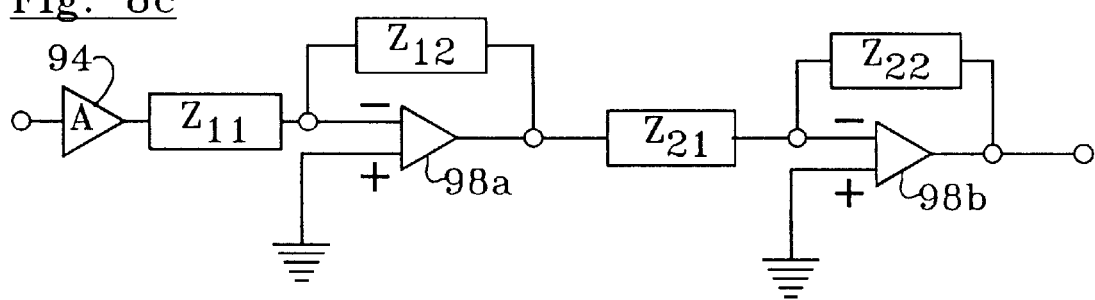
FIG. 8C is a schematic view of a compensation circuit of the present invention.

One possible design for a circuit that may be used as the phase-adjustment and amplitude-adjustment circuits 167 and 166, respectively, includes two inverting amplifier circuits connected in series, as shown in FIG. 8C. The impedance element $Z_{11}$ of the first inverting amplifier circuit may comprise a resistor (not shown) having the value $(R+R_P)$ and an inductor (not shown) having the value $L_P$, the resistor and inductor being connected in series. The impedance element $Z_{11}$ of the second inverting amplifier circuit may comprise a resistor (not shown) having the value $R_D$ and an inductor (not shown) having the value $L_D$, the resistor and inductor being connected in series. The impedance element $Z_{12}$ of the first inverting amplifier 98A, and the impedance element $Z_{11}$ of the second inverting amplifier 98B may have values such that their product equals the value: A B R. Any buffer amplifiers, such as amplifier 94, may provide unity gain. Thus the input signal $V_{CO}$ into the combining circuit 168 is substantially identical to the other input signal $V_{CP}$, and thus cancel. It will be appreciated that the example shown illustrates only one of many designs for combined phase and amplitude-adjustment circuits that may be used as amplitude and phase-adjustment circuits 166 and 167, respectively. Furthermore, it will also be appreciated that either or both phase and amplitude adjustment may be performed on the signal from the pickup coil 160, such as pickup signal $V_P$, in addition to, or instead of the phase adjustment and amplitude adjustment performed on the signal $V_O$ generated by the signal generator 162. For example, the amplitude-adjustment 164 circuit may be preceded or followed by, or comprise a phase-adjustment circuit (not shown) that adjusts the phase of the signal from the pickup coil 160.

Figure 13:
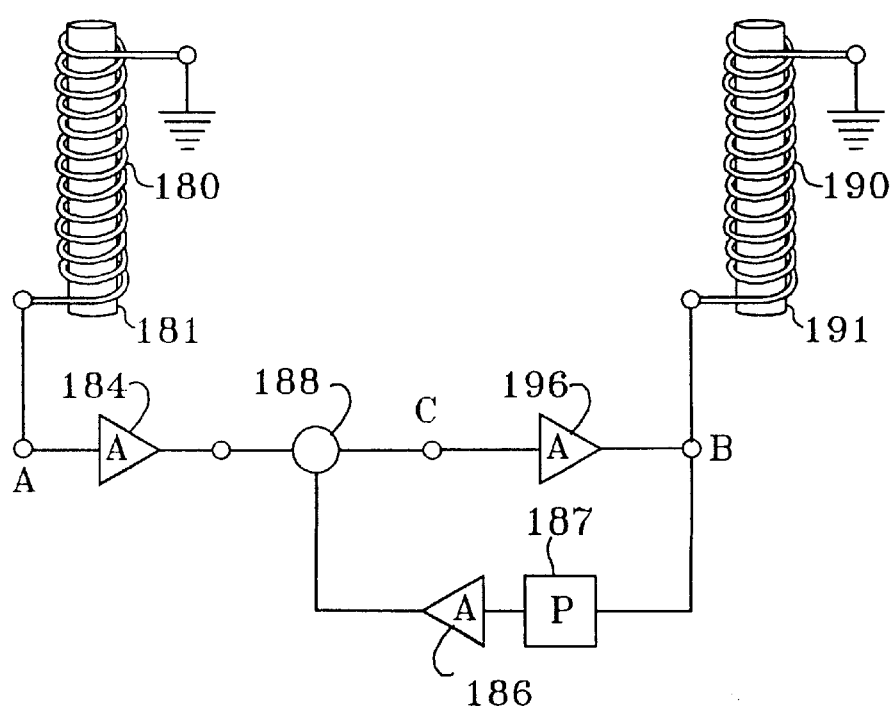
FIG. 13 is a schematic view of a cancellation circuit of the present invention wherein a reference signal is obtained from splitting the drive signal used to generate an electromagnetic flux.

Another embodiment for a cancellation circuit of the present invention is shown in FIG. 13. The receiver and transmitter elements in FIG. 13 include a pickup coil 180 wrapped around a pickup core 181 and a drive coil 190 wrapped around a second core 191. The pickup coil 180 is connected to the input of an amplitude-adjustment circuit 184 at Terminal A. An amplifier 196 generates a drive signal at Terminal B that flows through the drive coil 190 and generates a magnetic flux. The output of the amplifier 196 is connected to the input of a phase-adjustment circuit 187. Preferably, there is some sort of buffer (not shown) as part of the phase-adjustment circuit 187. For example, the buffer (not shown) may include a large value of resistance that forms a voltage divider with the drive coil 190 and attenuates the input signal to the phase-adjustment circuit 187. The output of the phase-adjustment circuit 187 is connected to an amplitude-adjustment circuit 186. The outputs of the amplitude-adjustment circuits 184 and 186 are connected to a combining circuit 188. The output of the combining circuit 188 provides a pickup signal at the input of the amplifier 196 (Terminal C) that is substantially free from the response of the pickup coil 180 to the magnetic flux generated by the drive coil 190.

The cancellation circuit shown in FIG. 13 demonstrates that a cancellation signal can be generated without requiring a second pickup device. Part of a drive signal used to generate an external magnetic flux may be combined with a pickup signal to cancel the response of a pickup device to the external magnetic flux. The signal $V_A$ at Terminal A represents a pickup signal $\beta V_D$ induced by the magnetic flux generated by the drive coil 190, where $V_D$ is the voltage of the drive signal flowing through the drive coil 190 and $\beta$ is a scaling factor that represents losses between the magnitude of the drive signal $V_D$ in the drive coil 190 and the magnitude of the pickup coil's 180 response to that drive signal $V_D$ after being amplified by the amplitude-adjustment circuit 184. The signal $V_A$ at Terminal A also includes an additional pickup signal $V_{Pickup}$ induced by magnetic flux generated by other sources other than the drive coil 190. Thus, $V_A = \beta V_D + V_{Pickup}$. The signal at Terminal B is $V_B = V_D + V_{DPickup}$, where $V_{DPickup}$ is a signal that the drive coil 190 picks up due to external sources of magnetic flux. If $V_D$ is much greater than $V_{DPickup}$, $V_{DPickup}$ can be ignored. Thus, $V_B \approx V_D$. The signal $V_B$ is attenuated by a factor of $\beta$ and its phase is adjusted in a feedback loop comprising amplitude-adjustment and phase-adjustment circuits 186 and 187, respectively. Signal $V_B$ is combined at the combining circuit 188 with the pickup signal $V_A = \beta V_D + V_{Pickup}$ from Terminal A. The resulting output of the combining circuit 188 (Terminal C) is $V_C = V_{Pickup}$. Thus, feedback resulting from the pickup coil's 180 response to the magnetic flux generated by the drive coil 190 is substantially eliminated.

Figure 14A:
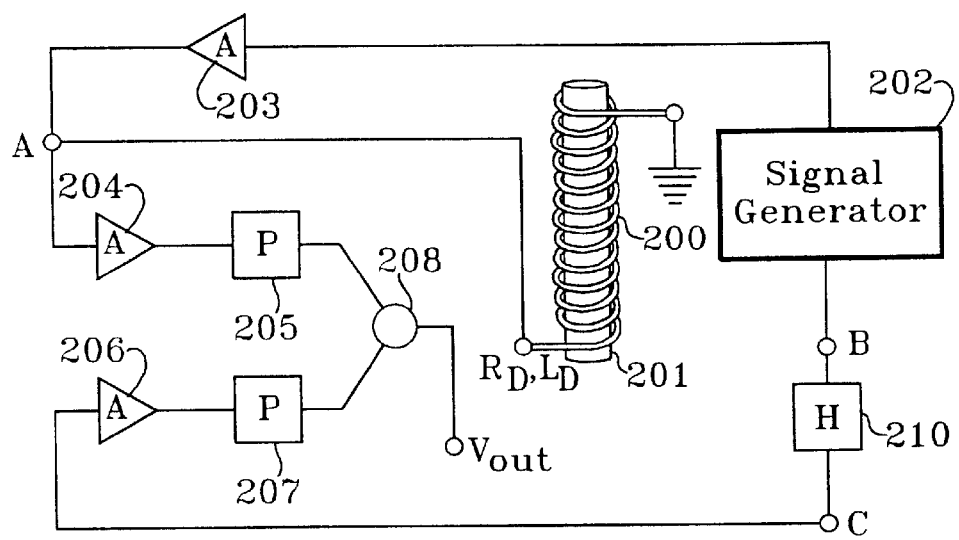
FIG. 14A is a schematic view of a cancellation circuit of the present invention for a single-element transmit/receive system that includes a harmonic-compensation circuit for canceling the non-linear response of nearby magnetically permeable materials.

A cancellation circuit of the present invention is shown in FIG. 14A. A signal generator 202 generates an electrical signal that is amplified by an amplifier 203 to produce a drive signal at Terminal A. The drive signal flows through a drive coil 200 and generates a magnetic flux. The drive coil 200 may be wrapped around a core, such as core 201. Terminal A is connected to an amplitude-adjustment circuit 204, which preferably draws only a small portion of the drive signal. Thus, the input of the amplitude-adjustment circuit 204 may include a buffer (not shown), such as a high-value resistor. The output of the amplitude-adjustment circuit 204 is connected to the input of a phase-adjustment circuit 205. The signal generator 202 has a second output (Terminal B) that produces a signal similar to the signal input to the amplifier 203. However, the second output signal may differ in phase and/or amplitude from the signal input to the amplifier 203. The second output of the signal generator 202 may be an output that is split from the input of the amplifier 203 by a splitting circuit (not shown). Terminal B is connected to the input of a harmonic-compensation circuit 210. The output of the harmonic-compensation circuit 210 is connected to Terminal C, which is connected to an amplitude-adjustment circuit 206. The output of the amplitude-adjustment circuit 206 is connected to the input of a phase-adjustment circuit 207. The outputs of both phase-adjustment circuits 205 and 207 are connected to separate inputs of a combining circuit 208. The combining circuit 208 produces an output signal $V_{out}$ that results from cancellation of the drive signals generated by the signal generator 202.

The drive coil 200 is responsive to external magnetic flux, even while a drive signal is flowing through the coil 200. If the drive coil 200 is not in close proximity to materials that have a non-linear response to external magnetic flux, then higher harmonic effects in the drive signal and/or pickup signal of the drive coil 200 are substantially negligible. Consequently, the harmonic compensation circuit 210 may be replaced by a short circuit connecting Terminal B to Terminal C. The signal voltage at Terminal A is $V_A = V_D + V_{Pickup}$, where $V_D$ is the voltage of the drive signal and $V_{Pickup}$ is the voltage of the induced pickup signal in the drive coil 200 resulting from external magnetic flux. The signal voltage at Terminal B is: $V_B = Q V_D$, where Q is a proportionality constant. Because the drive coil 200 has a complex impedance $Z_D = R_D + i\omega L_D$, and other circuit elements (not shown) associated with the drive coil 200 may also contribute frequency-dependent terms to the effective impedance of the coil 200, it is necessary that phase adjustment be performed to compensate for phase variations between the drive components $V_D$ of the signal voltages $V_A$ and $V_B$ at Terminals A and B, respectively. After phase adjustment and amplitude adjustment have been performed on either or both of the signals $V_A$ and $V_B$, these signals are combined in the combining circuit 208 such that the signal components related to the drive voltage $V_D$ cancel, leaving only a signal that is related to the pickup signal $V_{Pickup}$. This method of cancellation allows a single element, such as the drive coil 200 shown in FIG. 14A, to simultaneously transmit and receive electromagnetic signals. It will be appreciated that the output signal $V_{out}$ may include an interface (not shown) to the signal generator 202 to control the amplitude, frequency, and phase of the signal generated by the signal generator 202.

It will be further appreciated that if the core 201 is made of a ferromagnetic material, a voltage $V_H$ resulting from the non-linear response of that material to the magnetic flux generated by the drive coil 200 is included in the signal voltage $V_A$ at Terminal A: $V_A = V_D + V_{Pickup} + V_H$. Such non-linearity creates even harmonics $V_H$ in the fundamental driving frequency $V_D$ that are not reducible to zero by prior-art cancellation techniques. Thus, it may be necessary to eliminate the signal voltage $V_H$ resulting from the non-linear response of the core 201 material by providing the circuit with a filter (not shown) to filter out harmonic effects. The circuit may include a harmonic-compensation circuit, such as harmonic compensation circuit 210.

Figure 14B:
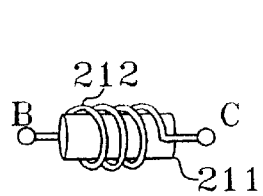
FIG. 14B is a schematic for a harmonic-compensation circuit of the present invention.

FIG. 14B shows a circuit that provides harmonic compensation. The circuit in FIG. 14B includes a coil 212 wrapped around a core 211 that has a substantially identical non-linear response to magnetic flux as does the core 201 shown in FIG. 14A. The coil 212 maybe oriented with respect to magnetic flux generated by the coil 200 such that the electrical signals induced in the coil 212 by the magnetic flux substantially cancel. The coil 212 may be provided with active magnetic shielding such as a cancellation circuit (not shown), or magnetic shielding materials (not shown) for substantially reducing the response of the coil 212 to magnetic flux generated by external magnetic sources (not shown). The material of the core 211 responds to the magnetic flux generated by the signal output $V_B$ of the signal generator 202 at terminal B and substantially reproduces the non-linear effect in the signal $V_B$ that is used to cancel the signal $V_A$.

Figure 14C:
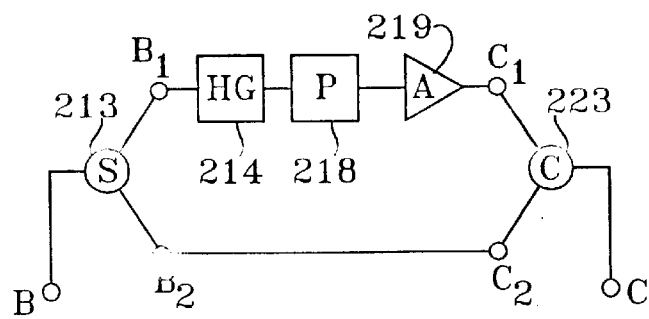
FIG. 14C is a schematic for a harmonic-compensation circuit of the present invention.

FIG. 14C shows a circuit that may be used as the harmonic compensation circuit 210. The circuit in FIG. 14C includes a splitting circuit 213 for splitting the input signal from Terminal B into two signals at output Terminals B1 and B2. The output terminal (Terminal B2) is connected to an input terminal (Terminal C2) of a combining circuit 223. Terminal B1 is connected to a harmonic-generator circuit 214 that substantially reproduces the shape of the harmonic signal $V_H$ in the signal voltage $V_A$ at Terminal A. The harmonic-generator circuit 214 may include one or more harmonic-generator circuits (not shown) known to persons skilled in the art as "frequency-doublers" or "frequency-triplers." The output of the harmonic-generator circuit 214 is connected to a phase-adjustment circuit 218. The phase-adjustment circuit 218 is connected to an input of an amplitude-adjustment circuit 219. The output of the amplitude-adjustment circuit 219 is connected to an input terminal (Terminal C1) of the combining circuit 223. A signal that is proportional to the drive signal $V_D$ is input to the combining circuit 223 at Terminal C2. A signal that is proportional to the harmonic signal $V_H$ is adjusted in phase and/or amplitude by the phase-adjustment circuit 218 and the amplitude-adjustment circuit 219 before being input to the combining circuit 223 at Terminal C1. The signal voltage $V_C$ at the output (Terminal C) of the combining circuit 223 has amplitude and phase relationships between signals $V_D$ and $V_H$ such that when that signal $V_C$ is combined with the amplitude-adjusted, phase-adjusted signal $V_A$ at the combining circuit 218, the contributions of the harmonic terms $V_H$ and the drive signal terms $V_D$ substantially cancel.

Figure 14D:
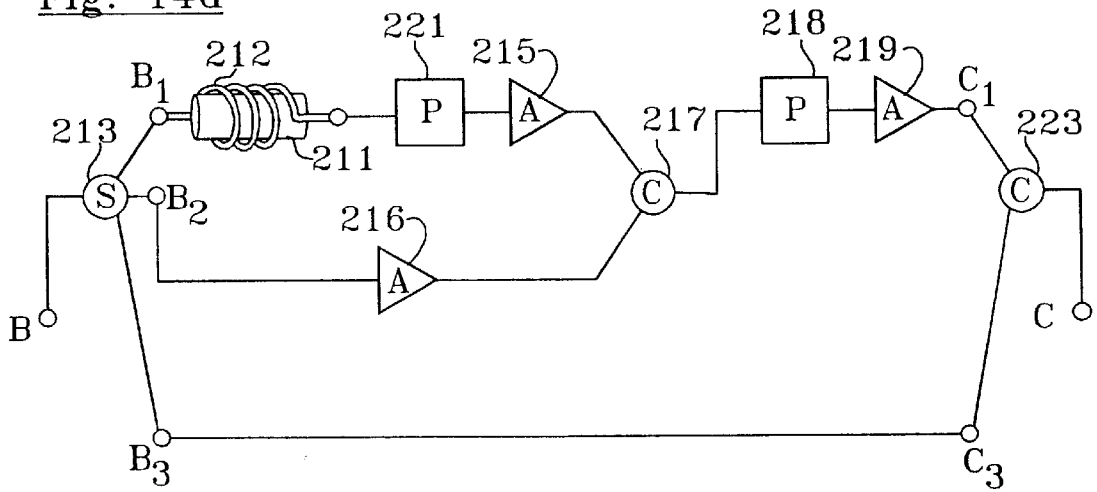
FIG. 14D is a schematic for a harmonic-compensation circuit of the present invention.

FIG. 14D shows a circuit that may be used as the harmonic compensation circuit 210. The circuit in FIG. 14D includes a splitting circuit 213 for splitting the input signal from Terminal B into three signals at output terminals B1, B2, and B3. Terminal B3 is connected to an input terminal (Terminal C3) of the combining circuit 223. Terminal B2 is connected to the input of an amplitude-adjustment circuit 216. Terminal B1 is connected to a coil 212 that is wrapped around a core 211. The core 211 is made of a material that has a non-linear response to magnetic flux that is substantially identical to the non-linear response of the core 201 material. Thus, the output of the coil 212 comprises a signal voltage having a component that is proportional to the drive signal $V_D$ and a component that is proportional to the harmonic signal $V_H$. The coil 212 is connected to the input of a phase-adjustment circuit 214. The output of the phase-adjustment circuit 214 is connected to the input of a an amplitude-adjustment circuit 215. The outputs of the amplitude-adjustment circuits 215 and 216 are connected to a combining circuit 217 that combines the outputs such that the contributions that are proportional to the drive signal voltage $V_D$ substantially cancel, providing a signal that is proportional to the harmonic signal $V_H$. The output of the combining circuit 217 is connected to a phase-adjustment circuit 218. The output of the phase-adjustment circuit 218 is connected to the input of an amplitude-adjustment circuit 219. The output of the amplitude-adjustment circuit 219 is connected to the input Terminal C1 of the combining circuit 223. The combining circuit 223 combines the harmonic signal $V_H$ and the drive signal $V_D$ such that their relative proportion and phase are substantially identical to the relative proportion and phase of the harmonic signal $V_H$ and drive signal $V_D$ in the signal $V_A$.

It will be appreciated that the splitting circuit 213 and the combining circuits 217 and 223 shown in FIG. 14C and FIG. 14D may control relative amplitudes between the split and combined electrical signals, thereby eliminating the need for amplitude-adjustment circuits 215, 216, and 219. In FIG. 14C and FIG. 14D, the output of the amplitude-adjustment circuit 219 is shown connected to an input terminal of the combining circuit 223. However, it will be appreciated that the output of the amplitude-adjustment circuit 219 may be connected to the output $V_{out}$ of the combining circuit 208.

Figure 15:
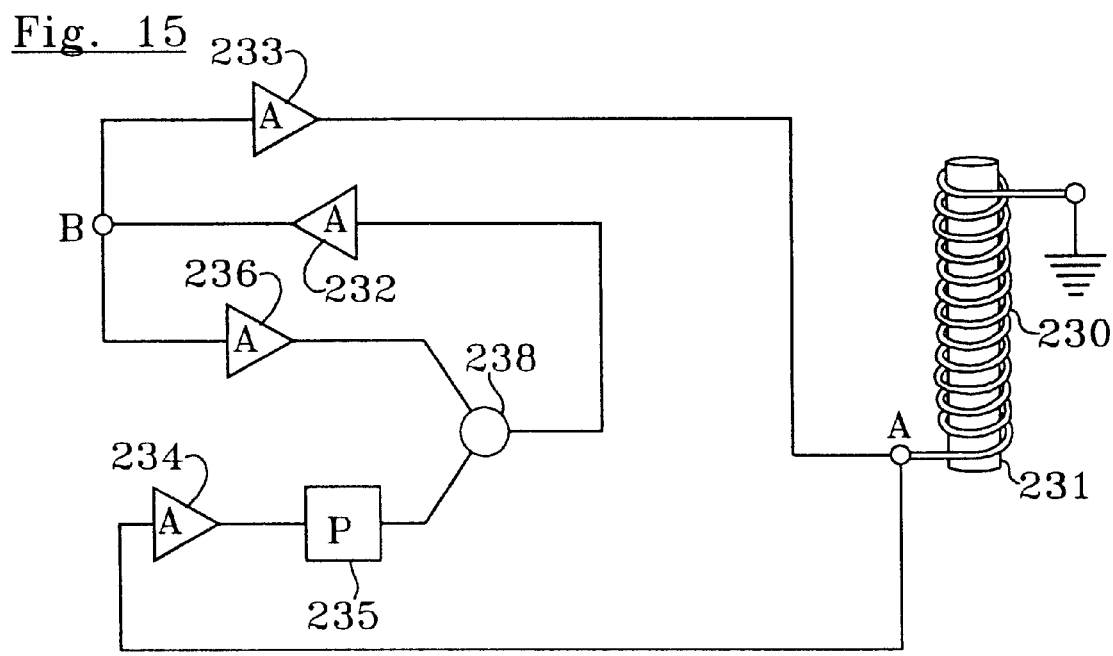
FIG. 15 is a schematic view of a cancellation circuit of the present invention for a single-element transmit/receive system.

The circuit shown in FIG. 15 is an embodiment of a cancellation circuit of the present invention for a simultaneous transmit/receive system. An electrical signal $V_B$ at a terminal (Terminal B) is amplified into a drive signal $V_D$ at an output (Terminal A) of an amplifier 233. Terminal A is connected to a drive coil 230 that may be wrapped around a core 231. Terminal A is connected to an amplitude-adjustment circuit 234 that may attenuate the output of the amplitude-adjustment circuit 234 so that it is substantially lower in amplitude than the drive signal $V_D$. The output of the amplitude-adjustment circuit 234 is connected to the input of a phase-adjustment circuit 235. Terminal B is connected to the input of an amplitude-adjustment circuit 236. The output of the amplitude-adjustment circuit 236 and the output of the phase-adjustment circuit 235 are connected to a combining circuit 238. The output of the combining circuit 238 is connected to a preamplifier 232. The output of the preamplifier 232 is connected to Terminal B.

The signal voltage $V_A$ at Terminal A comprises a drive voltage $V_D$, that flows through the drive coil 230 to generate a magnetic flux, and a pickup voltage $V_{Pickup}$ induced in the drive coil 230 by other sources (not shown) of magnetic flux. In this case, it is preferable that the material comprising the core 231 has a substantially linear response to the magnetic flux so as to minimize additive harmonic signatures $V_H$ caused by non-linear responses of the core 231 material to magnetic flux. The signal-voltage $V_B$ at Terminal B represents the drive signal $V_D$ before it is amplified by the amplifier 233. The phase-adjustment circuit 235 and the amplitude-adjustment circuits 234 and 236 adjust the relative phase and amplitude of the signals $V_A$ and $V_B$ so that the components in the signals $V_A$ and $V_B$ related to the drive signal $V_D$ substantially cancel when they are combined at the combining circuit 238.

The total gain of a feedback loop is calculated by summing the gains and losses of each component in the feedback loop. For example, the gain of the first feedback loop in FIG. 15 is measured starting at Terminal B and moving through the amplitude-adjustment circuit 236 to the combining circuit 238, then through the preamplifier 232 back to Terminal B. The amplitude-adjustment circuit 236 and the preamplifier 232 may provide gain or attenuation to the electrical signals. The combining circuit 238 provides an effective attenuation to the electrical signals by canceling the electrical signals representing the drive signal $V_D$. Thus, if the total gain of the first feedback loop is less than one, this part of the circuit will not cause oscillation.

The gain of the second feedback loop in the circuit shown in FIG. 15 is measured starting at Terminal A and including the amplitude-adjustment circuit 234, the phase-adjustment circuit 235, the combining circuit 238, the preamplifier 232, and the amplifier 233. The amplitude-adjustment circuit 234 includes a means for attenuating the signal $V_A$ at Terminal A. The preamplifier 232 and the amplifier 233 can provide substantial gain to the electrical signal. The phase-adjustment circuit 235 generally has little effect on the amplitude of the electrical signal. The combining circuit 238 will provide a substantial effective attenuation to the electrical signal flowing through it by canceling the signal voltage that is related to the drive signal $V_D$. If this cancellation is large enough, it will cause the total gain of the second feedback loop to be less than one. Thus, the circuit will not oscillate.

The pickup signal $V_{Pickup}$ induced in the drive coil 230 is amplified and returned to the drive coil 230 to generate a magnetic flux. However, the feedback effects of the drive signal $V_D$ in the circuit are canceled to prevent oscillation. This allows the drive coil 230 to simultaneously transmit and receive electromagnetic signal. It will be appreciated that if the core 231 is made of a material that has a non-linear response to magnetic flux, the cancellation circuit may be designed to cancel the electrical signals resulting from the non-linear response of the core 231 material. Different configurations of the cancellation circuit are shown in FIG. 14B through FIG. 14D. It will also be appreciated that either or both of the signals $V_A$ and $V_B$ from Terminals A and B, respectively, may have amplitude adjustment and/or phase adjustment applied to them such that the signal components related to the drive signal $V_D$ will cancel at the combining circuit 238. Furthermore, it will be appreciated that a compensation circuit (not shown) may be included in the feedback loop or may precede the drive coil 230 to provide a specific phase and/or amplitude relationship between the pickup signal $V_{Pickup}$ and the drive signal $V_D$.

Figure 16:
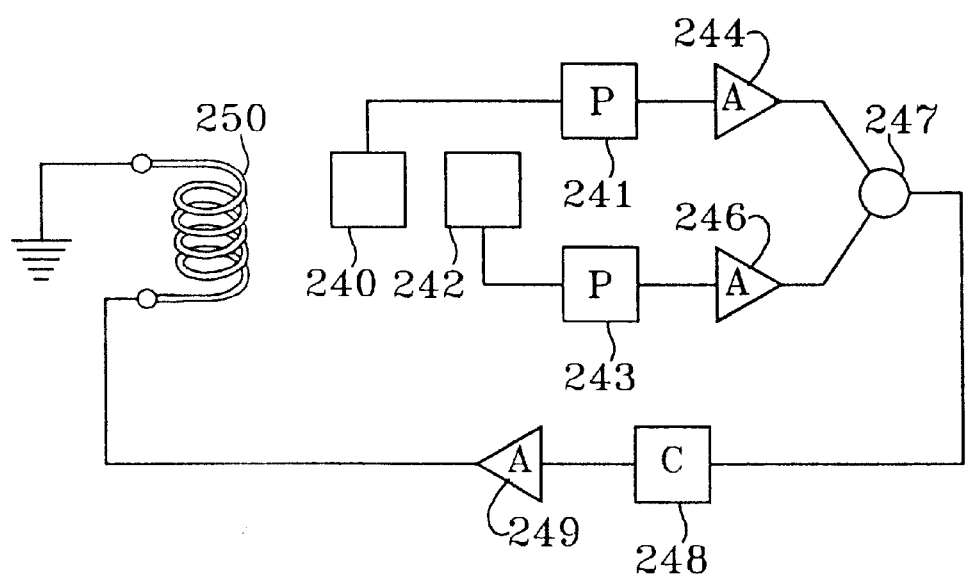
FIG. 16 is a schematic view of a cancellation circuit of the present invention used in a system that compensates for magnetic fields.

The circuit shown in FIG. 16 is an embodiment of a cancellation circuit of the present invention that cancels both static magnetic fields and magnetic flux in a specific region of space. The circuit in FIG. 16 includes two magnetic-field sensors 240 and 242 that generate electrical signals that are proportional to the scalar magnitude of the magnetic field strength in a specific direction at the location of each sensor 240 and 242. The sensors 240 and 242 may be flux gate sensors or the like. The phase of the signal from the first sensor 240 is adjusted by a phase-adjustment circuit 241. The amplitude of the signal from the first sensor 240 is adjusted by an amplitude-adjustment circuit 244. The phase of the signal from the second sensor 242 is adjusted by a phase-adjustment circuit 243. The amplitude of the signal from sensor 242 is adjusted by an amplitude-adjustment circuit 246. The outputs of the amplitude-adjustment circuits 244 and 246 are connected to a combining circuit 247. The output of the combining circuit 247 is connected to a compensation circuit 248, that is connected to the input of an amplifier 249. The amplifier 249 amplifies an input signal to produce a drive signal $V_D$ that flows through the drive coil 250 and produces a magnetic field that is substantially parallel to, but opposite to the magnetic field sensed by the sensors 240 and 242.

The first sensor 240 is positioned in close proximity to the coil 250 or inside the coil 250 to sense both the magnetic field generated by the coil 250 and the magnetic field generated by external sources (not shown). The second sensor 242 is positioned in such a manner so that it is more sensitive to magnetic fields generated by external sources (not shown) than to the magnetic field generated by the coil 250. Each of the sensors 240 and 242 has a specific ratio of response between the magnetic field generated by the coil 250 and the magnetic field generated by the external magnetic sources (not shown). It will be appreciated that there are many ways to change the ratio of response of one of the sensors 240 or 242, For example, the position of one of the sensors may be adjusted. The important point is to provide one of the sensors 240 or 242 with a different ratio of response than the other sensor 242 or 240. The amplitude and/or phase of the signals produced by the sensors 240 and 242 are adjusted by amplitude-adjustment circuits 244 and 246, respectively, and phase-adjustment circuits 241 and 243, respectively, such that the components of the signals related to the drive signal $V_D$ substantially cancel at the combining circuit 247. The output of the combining circuit will comprise a voltage $V_{Ext}$ that is proportional to the magnetic field intensity generated by the external sources (not shown).

The amplitude of the signals produced by the sensors 240 and 242 may be adjusted in order to cancel a dc signal resulting from the magnetic field generated by the drive coil 250. However, as the magnitude of the drive signal $V_D$ changes in response to a changing external magnetic field, there may be some response anomalies between the two sensors 240 and 242 related to the rate-of-change (flux) of the drive signal $V_D$. Thus, it may be necessary to compensate for flux-dependent amplitude differences and rate-of-response (phase) differences between the two sensors 240 and 242.

The drive coil 250 generates a highly uniform magnetic field within the region of space that it encloses. Thus, it is preferable to utilize the interior of the coil 250 as the space in which uniform magnetic fields will be canceled. However, due to the inductive properties of the coil 250 and the possible flux-dependent amplitude and phase characteristics of the sensors 240 and 242, it is necessary to provide phase and/or amplitude compensation using a compensation circuit (such as compensation circuit 248) in order to provide substantial cancellation of magnetic flux.

Figure 17:
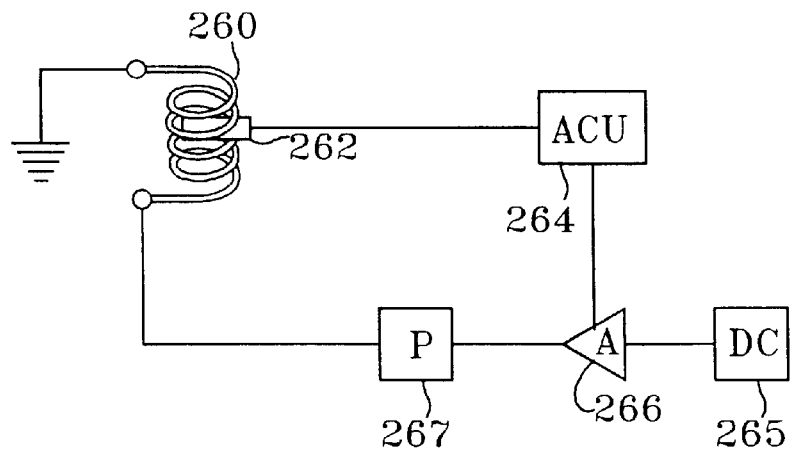
FIG. 17 is a schematic view of a cancellation circuit of the present invention used in a system that compensates for magnetic fields.

The circuit shown in FIG. 17 is another embodiment of a cancellation circuit of the present invention that cancels both static magnetic fields and magnetic flux in a specific region of space. The circuit in FIG. 17 includes a magnetic field sensor 262 that generates an electrical signal that is proportional to the scalar magnitude of magnetic-field strength in a specific direction at the location of the sensor 262. It will be appreciated that the sensor 262 may be a flux gate sensor or the like. The signal produced by the sensor 262 is sent to an automatic control unit 264. The automatic-control unit 264 controls the gain of an amplifier 266 connected to a dc-level generator 265. The output of the amplifier 266 is an amplified or attenuated dc-level drive signal $V_D$ that is passed through a compensation circuit 267 to a drive coil 260, which generates a magnetic field.

The magnetic-field sensor 262 is preferably positioned inside the region of space where cancellation of magnetic fields is desired. The magnetic-field sensor 262 produces a signal that is proportional to the amplitude of the magnetic field it senses. The magnetic field comprises the magnetic field generated by the drive coil 260 and magnetic fields generated by other sources (not shown). The automatic-control unit 264 determines if a magnetic field is present at the sensor 262 and controls the amplifier 266 so that the drive signal $V_D$ in the drive coil 260 produces a magnetic field that cancels the magnetic field at the sensor 262. Because the drive coil 260 has inductive properties, there will be an inductive lag in the drive signal $V_D$ flowing through the drive coil 260 when the amplitude of that signal changes. Likewise, the effective impedance $Z_D = R_D + i\omega L_D$ of the coil 260 changes with signal frequency $\omega$. Thus, a signal flux results in an amplitude variation of the magnetic field generated by the drive coil 260. The compensation circuit 267 provides phase adjustment and amplitude adjustment to the drive signal $V_D$ so that the drive coil 260 cancels both static and dynamic magnetic fields.

It will be appreciated that the compensation circuit 267 may also provide compensation for any flux-dependent amplitude and phase variations in the response of the sensor 262. It will also be appreciated that the automatic control unit 264 provide amplitude and phase compensation to the drive signal $V_D$. The circuits shown in FIG. 16 and FIG. 17 show systems that cancel magnetic fields along a single axis. However, a superposition of three such circuits, each along an orthogonal axis, can provide complete cancellation of magnetic fields in three dimensions.

Because coils of wire whose currents support magnetic fields in space function as antennas radiating electromagnetic energy, it is obvious that the cancellation and/or compensation circuits shown above may be used in radar systems for providing interference cancellation and simultaneous transmit/receive capability.

Figure 18:
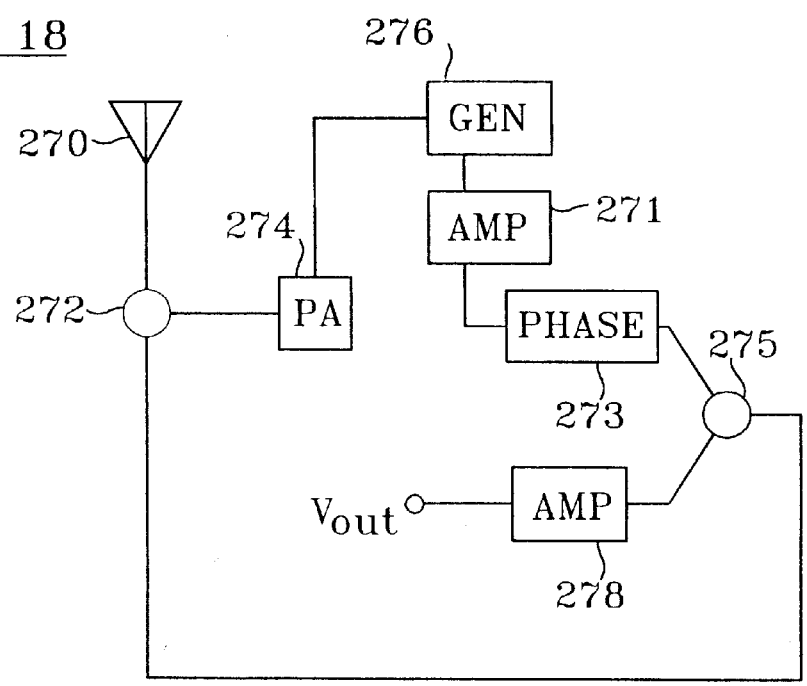
FIG. 18 is a schematic view of a cancellation circuit of the present invention used in a single-element transmit/receive system.

The circuit shown in FIG. 18 is a preferred embodiment of a cancellation circuit of the present invention. A signal generator 276 generates an electrical generator signal $V_G$ that is amplified by a power amplifier 274 and passed through a junction 272 to an antenna element 270. Antenna element 270 both emits and receives electromagnetic radiation. The antenna element 270 is responsive to other sources (not shown) of electromagnetic radiation, thus producing an electrical pickup signal $V_P$. The junction 272 is connected to an input of a combining circuit 275 that receives the pickup signal $V_P$ along with a leakage signal $V_L$ from the power amplifier 274, The leakage signal $V_L$ is a portion of the generator signal $V_G$. The signal generator 276 also produces a reference signal $V_R$ that is similar in shape to the generator signal $V_G$. The reference signal $V_R$ passes through an amplitude-adjustment circuit 271 and a phase-adjustment circuit 273 to an input of the combining circuit 275. An amplifier 278 amplifies the output of the combining circuit 275.

The junction 272, which the generator signal $V_G$ passes through on its way to the antenna element 270, may be a circulator (not shown) that directs most of the power from the power amplifier 274 to the antenna element 270. However, because the efficiency of a circulator is frequency-dependent on the electrical signals passing through it, the performance of the circulator (not shown) is degraded by the use of large signal-bandwidths or multiple frequencies. Therefore, some of the energy from the power amplifier 274 leaks into the combining circuit 275. The amplitude-adjustment circuit 271 provides frequency-dependent amplitude adjustment to the reference signal $V_R$ such that its amplitude is substantially identical to the amplitude of the leakage signal $V_L$ leaked from the power amplifier 274 into the combining circuit 275. It will be appreciated that the amplitude-adjustment circuit 271 may be a circulator that is similar to the circulator used as the junction 272. Thus, the output of the amplitude-adjustment circuit 271 is substantially proportional to the amplitude of the leakage signal $V_L$. The phase-adjustment circuit 273 adjusts the phase of the reference signal $V_R$ such that it cancels the leakage signal $V_L$ at the combining circuit 275. Preferably, the phase-adjustment circuit 273 produces a substantially constant phase between the leakage signal $V_L$ and the reference signal $V_R$ over the desired frequency range of generated signals $V_G$. Thus, the output of the combining circuit 275 will comprise a pickup signal $V_P$ that is substantially free from the effects of leakage signal $V_L$ originating from the power amplifier 274.

It will be appreciated that many possible designs exist for cancellation circuits that cancel the effects of interference between the transmitting and receiving elements of a radiating system. The circuit shown in FIG. 18 is only one of these designs. Amplitude and/or phase-adjustment circuits (not shown) may be interposed in the circuit between the junction 272 and the combining circuit 275. Furthermore, in the case where amplitude-modulated and/or frequency-modulated signals are generated and received, the circuit may include filters (not shown) for filtering out the carrier frequency before the cancellation circuit removes the transmitted signal from the received signal.

The phase-adjustment circuit 273 may include a delay apparatus (not shown), such as from nearby objects (such as ground clutter) is canceled from the pickup signal $V_P$. The reference signal $V_R$ may also include electrical signals that are similar in shape to signals induced by other noise sources (not shown) in the antenna element 270. Separate amplitude adjustment and phase adjustment may be performed to cancel the response of the antenna element 270 to the other noise sources (not shown). Furthermore, the antenna element 270 may be responsive to incident radiation for producing a drive signal that allows an antenna, such as the antenna element 270, to transmit electromagnetic radiation that cancels the reflection of the incident radiation off of the antenna element 270 or some other object (not shown). Thus, the reflected radiation may be canceled at a distant receiver (not shown).

Magnetic pickups comprising pickup coils are shown in the circuits of FIG. 2 through FIG. 15, however any type of electromagnetic pickup may be used with these types of cancellation circuits. Likewise, a compensation circuit may be used to compensate for amplitude and phase variations arising from any pickup device that produces an electrical pickup signal. A cancellation circuit may be used to cancel the electrical signals arising from the response of the pickup device to noise. For example, a cancellation circuit may be used for canceling the signals generated by an optical sensor's electrical response to background electromagnetic radiation. In many of the figures, a drive coil is illustrated as the element that generates an electromagnetic field. However, compensation circuits may be used to compensate for frequency-response characteristics exhibited by any structures that generate electromagnetic fields.

The preferred methods of amplitude adjustment were shown to be electrical gain and attenuation controls. However, it will be appreciated that other methods of amplitude adjustment may be used, such as adjusting the relative position of the pickup coils, the drive coils, the cores for the pickup coils and drive coils, and/or nearby permeable and/or conducting materials. It will also be appreciated that the inductance of a coil may be changed by changing the reluctance of the path seen by that coil's magnetic field.

The magnitude of electrical current in the pickup coils was considered to be very small. Thus, the formulation of the equations representing the electrical pickup signals induced in the pickup coils by magnetic flux have not included the inductive effects that the pickup coils may have on each other. However, the scope and spirit of the present invention would not be challenged by considering the inductive effects between pickup coils when designing the cancellation circuits. Furthermore, consideration of the more subtle electromagnetic effects (such as how capacitance in the pickup coils affects the induction of electrical signals in the pickup coils) and how the cancellation and compensation circuits that may be designed accordingly is anticipated by this invention.

Although the invention has been described in detail with reference to the illustrated preferred embodiments, variations and modifications exist within the scope and spirit of the invention as described and as defined in the following claims.

What is claimed is:

1. An electromagnetic transceiver capable of simultaneously transmitting and receiving electromagnetic signals, the transceiver including:

an antenna system capable of transmitting and receiving the electromagnetic signals, a signal transmitter coupled to the antenna system, the transmitter adapted to couple electromagnetic signals to the antenna system for transmission, a receiver coupled to the antenna system, the receiver adapted to be responsive to the transmitted electromagnetic signals and electromagnetic signals received by the antenna system, a cancellation circuit coupled to the transmitter and to the receiver, the cancellation circuit adapted to couple at least one cancellation signal to the receiver that reduces the responsiveness of the receiver to the transmitted signals, the cancellation circuit characterized by at least one of:

an amplitude-adjustment circuit adapted to compensate for amplitude differences between the at least one cancellation signal and the receiver response to the transmitted signals resulting from at least one of:

a) differences in propagation between the transmitted signals and the at least one cancellation signal to the receiver, and b) differences in the responsiveness of the receiver to the transmitted signals and the at least one cancellation signal, and a phase-adjustment circuit adapted to compensate for phase differences between the at least one cancellation signal and the receiver response to the transmitted signals resulting from at least one of:
   a) differences in propagation between the transmitted signals and the at least one cancellation signal to the receiver, and
   b) differences in the responsiveness of the receiver to the transmitted signals and the at least one cancellation signal.

2. The electromagnetic transceiver recited in claim 1 wherein the receiver is electrically coupled to the transmitter.

3. The electromagnetic transceiver recited in claim 1 wherein the antenna system includes at least one receiving antenna and at least one transmitting antenna and the receiver is electromagnetically coupled to the transmitter.

4. The electromagnetic transceiver recited in claim 1 wherein the cancellation circuit is electrically coupled to the transmitter and electrically coupled to the receiver.

5. The electromagnetic transceiver recited in claim 1 wherein the cancellation circuit is electrically coupled to the transmitter and electromagnetically coupled to the receiver.

6. The electromagnetic transceiver recited in claim 1 wherein the cancellation circuit is electromagnetically coupled to the transmitter and electrically coupled to the receiver.

7. The electromagnetic transceiver recited in claim 1 wherein the antenna system includes an array of antennas.

8. The electromagnetic transceiver recited in claim 1 wherein the phase-adjustment circuit includes at least one delay device adapted to delay at least one of the received signals or at least one of the cancellation signals to provide relative phase adjustment between the at least one receive signal and the at least one cancellation signal.

9. The electromagnetic transceiver recited in claim 1 wherein the cancellation circuit is adapted to provide at least one of frequency-dependent amplitude adjustment and frequency-dependent phase adjustment to cancel the receiver response to transmitted signals having multiple narrowband frequencies.

10. A cancellation circuit coupled to an electromagnetic receiver, the cancellation circuit adapted to couple at least one cancellation signal to the receiver for reducing the responsiveness of the receiver to transmitted signals generated by the transmitter, the cancellation circuit including at least one of:
   an amplitude-adjustment circuit adapted to compensate for amplitude differences between the at least one cancellation signal and the receiver response to the transmitted signals resulting from at least one of:
     a. differences in propagation between the transmitted signals and the at least one cancellation signal to the receiver, and
     b. differences in the responsiveness of the receiver to the transmitted signals and the at least one cancellation signal, and
   a phase-adjustment circuit adapted to compensate for phase differences between the at least one cancellation signal and the receiver response to the transmitted signals resulting from at least one of:
     a. differences in propagation between the transmitted signals and the at least one cancellation signal to the receiver, and
     b. differences in the responsiveness of the receiver to the transmitted signals and the at least one cancellation signal.

11. The cancellation circuit recited in claim 10 wherein the phase-adjustment circuit includes at least one delay device adapted to delay either or both at least one of the received signals and at least one of the cancellation signals to provide relative phase adjustment between the at least one receive signal and the at least one cancellation signal.

12. The cancellation circuit recited in claim 10 wherein the cancellation circuit is adapted to provide at least one of frequency-dependent amplitude adjustment and frequency-dependent phase adjustment to cancel the receiver response to transmitted signals having multiple narrowband frequencies.

13. The cancellation circuit recited in claim 10 wherein the transmitter and the receiver are electrically coupled to an antenna system.

14. The cancellation circuit recited in claim 10 wherein the cancellation circuit is adapted to be electrically coupled to the transmitter.

15. The cancellation circuit recited in claim 10 wherein the cancellation circuit is adapted to be electromagnetically coupled to the transmitter.

16. The cancellation circuit recited in claim 10 wherein the cancellation circuit includes a signal generator for generating the at least one cancellation signal.

17. A method of simultaneously transmitting and receiving electromagnetic signals including:
   providing for coupling of at least one transmitted electromagnetic signal from at least one transmitter to a communication channel and coupling at least one received electromagnetic signal into at least one receiver that is responsive to the at least one received signal and to the at least one transmitted signal,
   providing for reducing the response of the at least one receiver to at least one of the transmitted signals, the step of reducing the receiver response including generating at least one cancellation signal adapted to cancel the receiver response to the at least one transmitted signal, the step of generating the at least one cancellation signal including at least one of:
   providing for amplitude adjustment of the at least one cancellation signal to compensate for amplitude differences between the at least one cancellation signal and the receiver response to the transmitted signals resulting from at least one of:
     a) differences in propagation between the transmitted signals and the at least one cancellation signal to the receiver, and
     b) differences in the responsiveness of the receiver to the transmitted signals and the at least one cancellation signal, and
   providing for phase-adjustment of the at least one cancellation signal to compensate for phase differences between the at least one cancellation signal and the receiver response to the transmitted signals resulting from at least one of:
     a) differences in propagation between the transmitted signals and the at least one cancellation signal to the receiver, and
     b) differences in the responsiveness of the receiver to the transmitted signals and the at least one cancellation signal.

18. The method recited in claim 17 wherein the step of providing for phase-adjustment includes providing for delay of either or both the at least one received signal and the at least one cancellation signal.

19. The method recited in claim 17 wherein the step of providing for phase-adjustment includes providing for at least one of frequency-dependent amplitude adjustment and frequency-dependent phase adjustment to cancel the receiver response to transmitted signals having multiple narrowband frequencies.

20. The method recited in claim 17 wherein the step of generating at least one cancellation signal includes providing for electrically coupling a portion of the at least one transmitted signal.

* * * * *